United States Patent [19]

Tsukune et al.

[11] Patent Number: 5,314,724
[45] Date of Patent: May 24, 1994

[54] PROCESS FOR FORMING SILICON OXIDE FILM

[75] Inventors: Atuhiro Tsukune; Yuji Furumura; Hatanaka Masanobu, all of Kawasaki, Japan

[73] Assignees: Fujitsu Limited, Kawasaki; Fujitsu VLSI Limited, Kasugai, both of Japan

[21] Appl. No.: 923,882

[22] PCT Filed: Dec. 19, 1991

[86] PCT No.: PCT/JP91/01739
§ 371 Date: Aug. 27, 1992
§ 102(e) Date: Aug. 27, 1992

[87] PCT Pub. No.: WO92/12535
PCT Pub. Date: Jul. 23, 1992

[30] Foreign Application Priority Data

Jan. 8, 1991 [JP] Japan ................. 3-000734
Mar. 26, 1991 [JP] Japan ................. 3-062133

[51] Int. Cl.$^5$ .............................. B05D 3/06
[52] U.S. Cl. ........................ 427/489; 427/58; 427/255.3; 427/255.6; 427/255.7; 427/294; 427/387; 427/492; 427/535; 427/553; 427/558; 427/578; 427/588
[58] Field of Search ............... 427/489, 492, 535, 553, 427/558, 578, 588, 58, 255.3, 255.6, 387, 294, 255.7

[56] References Cited

FOREIGN PATENT DOCUMENTS 54-94878  7/1979  Japan .
1-307247 12/1989  Japan .
2-78225  3/1990  Japan .
2-262336 10/1990 Japan .

OTHER PUBLICATIONS

Zagata et al., "Dielectric Films Prepared by Low-Temperature Oxidation of Tetraethoxysilane," Chemical Abstracts, vol. 77, No. 12, Sep. 18, 1972, Abstract No. 81056n, p. 430 & Late PSR Zinat. Akad. Vestis, Fiz. Tch. Zinat. Ser., vol. 3, 1972, pp. 34–39.

*Primary Examiner*—Bernard Pianalto
*Attorney, Agent, or Firm*—Staas & Halsey

[57] ABSTRACT

A process for the formation of a silicon oxide film, comprising the steps of exciting a gas comprising an organosilane or organosiloxane gas and a gas containing H and OH above a substrate in a reaction chamber to react them with each other in a gaseous phase or on the substrate, thereby depositing a thin film of an organic-group-containing silanol, silanol polymer, or siloxane-bonded polymer on the substrate, and removing the organic groups from the thin film to form a silicon oxide film. Preferably, the formation of a film is conducted while repeating the step of deposition and the step of removing the organic groups through a plasma treatment within an identical chamber, and the film is further heat-treated at a temperature of 450° C. or below. Thus, a good insulating film having a flatness comparable to that of an SOG film can be obtained.

26 Claims, 33 Drawing Sheets

PRESENT INVENTION

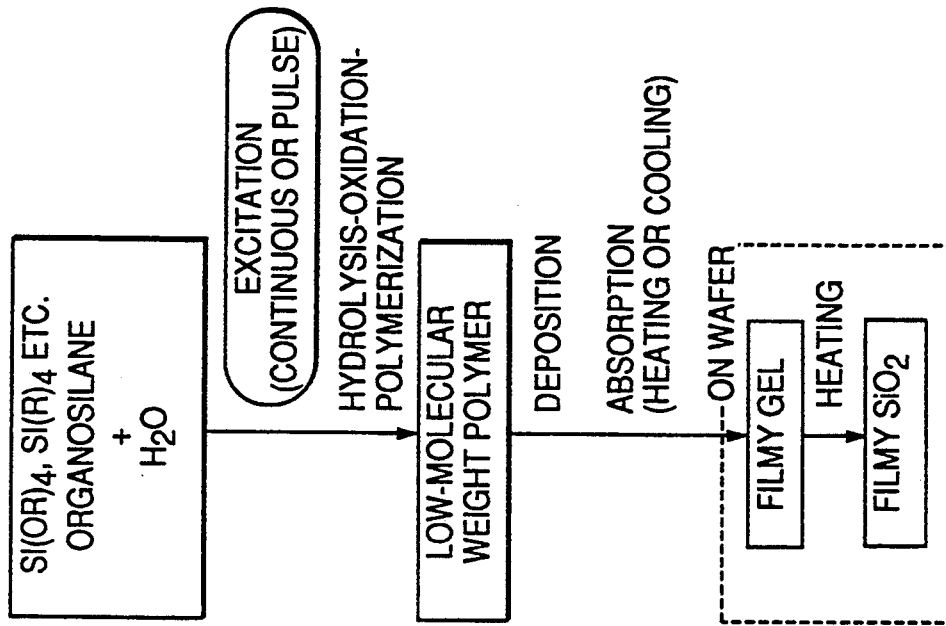
FIG. 5B PRESENT INVENTION
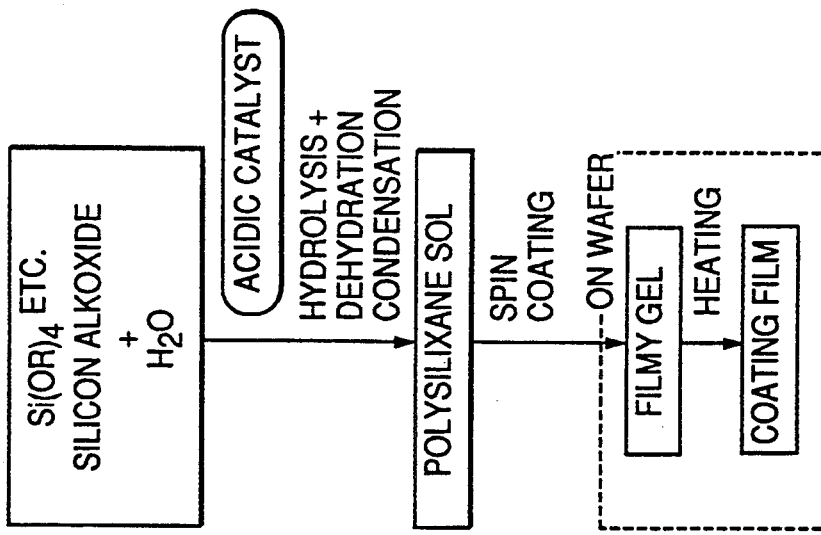
FIG. 5A PRIOR ART

FIG. 6A
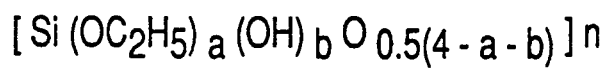
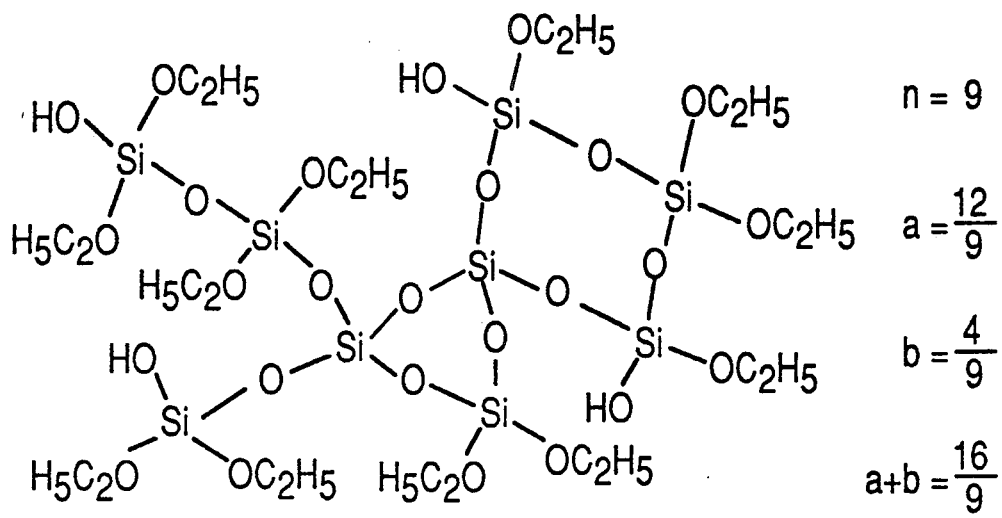
$n = 9$
$a = \frac{12}{9}$
$b = \frac{4}{9}$
$a+b = \frac{16}{9}$
FIG. 6B
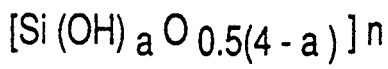
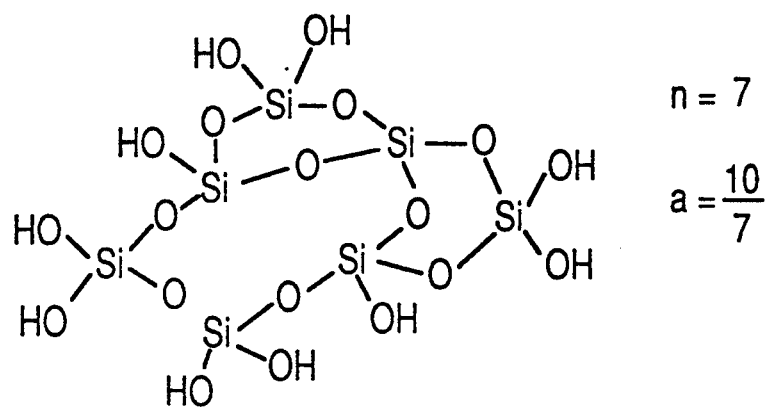
$n = 7$
$a = \frac{10}{7}$ The temp. of the wafer is ① > ② > ③.

10 Torr

5 Torr

1 Torr 0.2 Torr

FIG. 11

<PROCESS CONDITIONS>

DEPOSITIONS: 10 TORR  RF: 13.56 MHz  PULSE: 13.35 msec (75Hz)  DUTY: 30%
RF POWER: 300 W  (PULSE: 300W X 30%)
DISTANCE BETWEEN ELECTRODES: 10mm    TOTAL FLOW RATE: 375 sccm

| TEMP / RF / FLOW RATE-FLOW RATE RATIO | R.T. (37 °C) CONSTANT WAVE | R.T. (37 °C) PULSE WAVE (DUTY: 30%) |
|---|---|---|
| TEOS / $H_2O$ =20 sccm / 300 sccm (1 : 15) | G.R.: ABOUT 4000 Å / min<br>REFRACTIVE INDEX : 1.365<br>COMMENT : SOLID PHASE DEPOSITION SIGNIFICANTLY CLOUDY STATE | G.R.: ABOUT 7000 Å / min<br>REFRACTIVE INDEX : 1.444<br>COMMENT : SOLID PHASE DEPOSITION NOT CLOUDY |
| TEOS / $H_2O$ =30 sccm / 300 sccm (1 : 10) | G.R.: ABOUT 12000 Å / min<br>REFRACTIVE INDEX : 1.409<br>COMMENT : SOLID PHASE DEPOSITION MODERATELY CLOUDY STATE | G.R.: ABOUT 11000 Å / min<br>REFRACTIVE INDEX : 1.400<br>COMMENT : LIQUID PHASE DEPOSITION NOT CLOUDY |
| TEOS / $H_2O$ =50 sccm / 300 sccm (1 : 6) | G.R.: ABOUT 23000 Å / min<br>REFRACTIVE INDEX : 1.442<br>COMMENT : LIQUID PHASE DEPOSITION | G.R.: ABOUT 17000 Å / min<br>REFRACTIVE INDEX : 1.498<br>COMMENT : LIQUID PHASE DEPOSITION |
| TEOS / $H_2O$ =75 sccm / 300 sccm (1 : 4) | G.R.: ABOUT 22000 Å / min<br>REFRACTIVE INDEX : 1.432<br>COMMENT : LIQUID PHASE DEPOSITION | G.R.: ABOUT 8500 Å / min<br>REFRACTIVE INDEX : 1.444<br>COMMENT : LIQUID PHASE DEPOSITION |
| TEOS / $H_2O$ * =30 sccm / 300 sccm (1 : 2) | : LIQUID PHASE DEPOSITION | : LIQUID PHASE DEPOSITION |

NOTE) *: PROCESS CONDITIONS ARE DIFFERENT FROM THOSE OF OTHER CASES

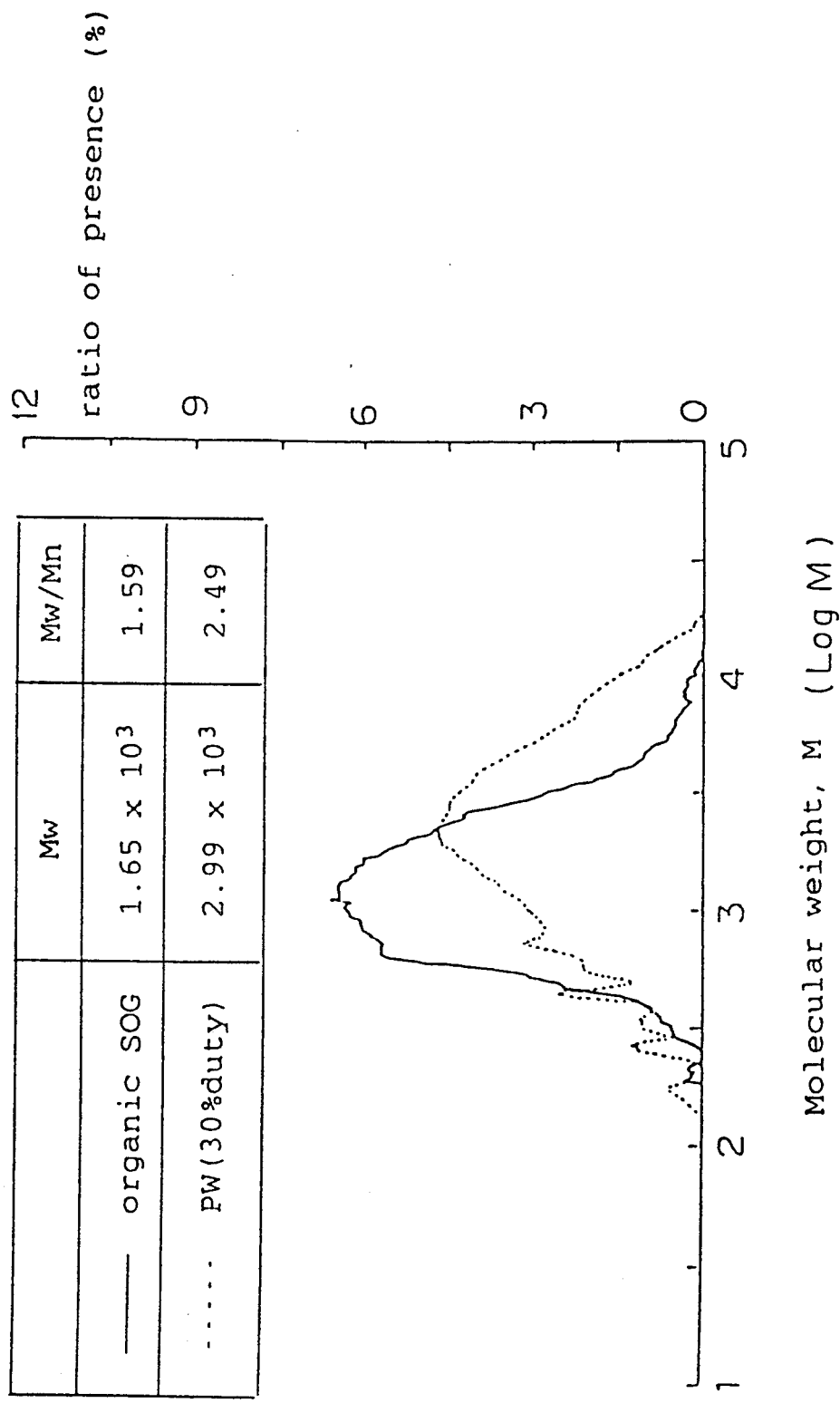

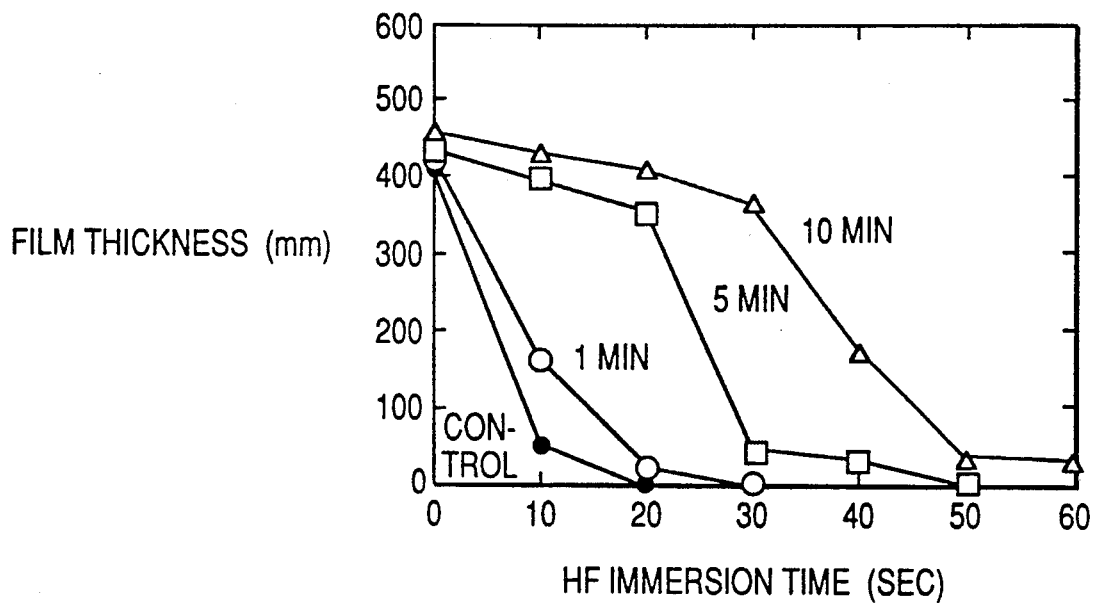

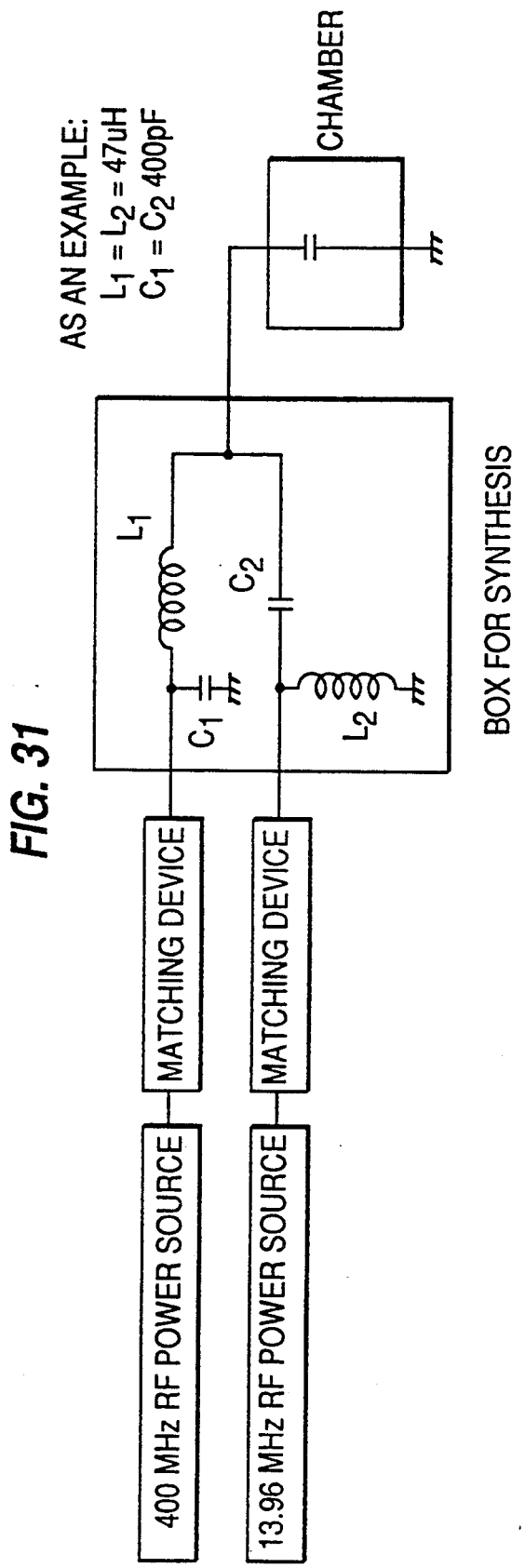

PROCESS FOR FORMING SILICON OXIDE FILM

FIELD OF THE INVENTION

The present invention relates to a process for the formation of a silicon oxide film and particularly to a process for forming an interlayer insulation film of $SiO_2$ or the like between layers of a multilayer interconnection of a semiconductor device.

STATE OF THE RELATED ART

In recent years, progress in the miniaturization and multilayer interconnection of semiconductor devices has led to an increase in the aspect ratio, with the result that uneven portions on the surface of a pattern have had a serious influence on the reliability of the device.

For this reason, the development of a process for the formation of a semiconductor device which enables planarization of an insulating film provided for protecting and insulating an element and wiring, has been desired in the art.

The SOG (spin-on-glass) process has been widely utilized as a technique for planarizing an interlayer insulation film provided between Al wirings layers. This technique, however, has many problems, and the development of a novel CVD process capable of providing a conformal or fluid form has been intensively studied in the art.

The SOG method is classified into the inorganic SOG and the organic SOG methods. In the inorganic SOG method, it is difficult to increase the thickness of the film due to the occurrence of a large film shrinkage, and multi-coating is necessary even for attaining a film thickness of about 300 nm. On the other hand, in the organic SOG method, although an increase in the film thickness is possible, organic groups remaining in the film give rise to rapid oxidation decomposition in an $O_2$ plasma or in an $O_2$ atmosphere at a high temperature. In general, an SOG film has a much higher hygroscopicity than other CVD oxide films and becomes an adsorption source of moisture when it is exposed to the air. Degassing due to said adsorption of moisture, generation of the formed water from the film due to undercuring, etc. are causative of a lowering in the reliability. For this reason, in order to prevent the SOG film from being exposed on the side wall of a through hole, the combined use of an etch back process is necessary in a process wherein use is made of SOG.

SUMMARY OF THE INVENTION

An object of the present invention is to provide a process for the formation of a planarized insulation film having a desired thickness and a high reliability.

According to the present invention, in order to attain the above-described object, there is provided a process for the formation of a silicon oxide film, comprising the steps of: exciting a gas, comprising an organosilane or organosiloxane gas and a gas containing H and OH, above a substrate in a reaction chamber to cause them to a react with each other in a gaseous phase or on the substrate, thereby depositing a thin film of an organic-group-containing silanol, silanol polymer, or siloxane-bonded polymer on the substrate; and removing the organic groups from the thin film to form a silicon oxide film.

According to a preferred embodiment, the removal of the organic groups is performed by a plasma treatment. In particular, the step of deposition and the step of plasma treatment are alternately repeated in an identical reaction chamber to form a silicon oxide film having a desired film thickness on a substrate.

It is preferred to conduct the excitation by means of pulsation. In this case, the excitation time is sufficiently short, such that the organosilane or organosiloxane gas or its reaction product can still contain organic groups when it reaches the substrate.

According to one preferred embodiment, the deposition is conducted through the use of planar-type plasma CVD system under conditions of a pressure of 5 to 15 Torr, a temperature of room temperature to 250° C., a distance between electrodes of 6 to 25 mm, a gas flow rate of 100 to 18000 cm³/min, a discharge power of 100 to 500 W, and a discharge "on" time satisfying a requirement represented by the formula $$D \leq \frac{300}{P} \{140 - (140/310)T\}$$

wherein D represents a discharge time in terms of % by assuming the time required for a gas to reach the substrate after the introduction thereof into the plasma region to be 100, P represents an RF powder, and T represents the temperature of the substrate.

BRIEF DESCRIPTION OF THE DRAWINGS

FIGS. 5A and 5B are diagrams for illustrating the principle of the present invention;

FIGS. 6A and 6B are diagrams showing a product of a reaction of TEOS with $H_2O$ for illustrating the present invention;

FIG. 11 is a diagram showing the dependency of the state of a thin film of silicon oxide upon the flow rate ratio and the pulse;

FIG. 21 is a diagram showing a molecular weight distribution of a film formed according to the sixth example of the present invention;

FIGS. 23A and 23B are respectively a flow diagram of a process wherein a plasma treatment is conducted after deposition according to the seventh example of the present invention and a diagram of the etching rate of a film formed by this process;

FIG. 31 is a diagram showing a box for electrical synthesis of the application method shown in FIG. 30B applicable to the present invention.

DETAILED DESCRIPTION OF THE INVENTION

Prior to a specific description of the present invention, the prior art will be described in more detail with reference to the drawings.

Figure 1A:
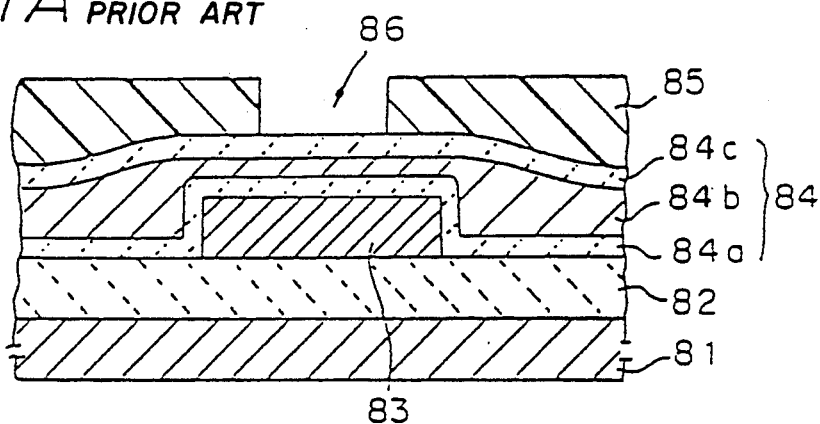
FIGS. 1A, 1B and 1C are diagrams for illustrating one example of the conventional process.
Figure 1B:
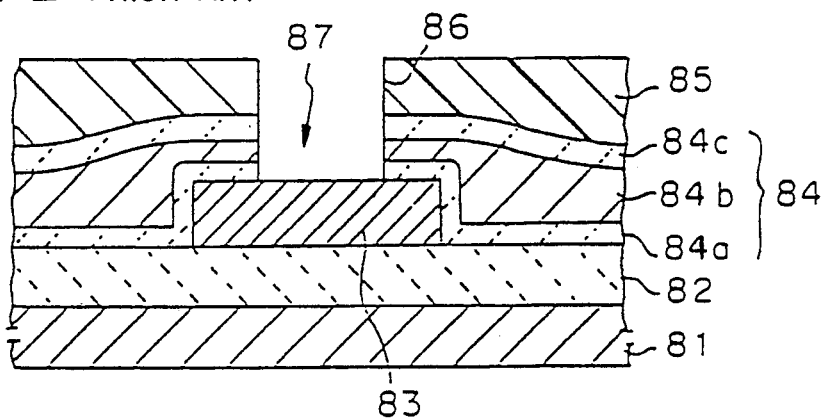
Figure 1C:
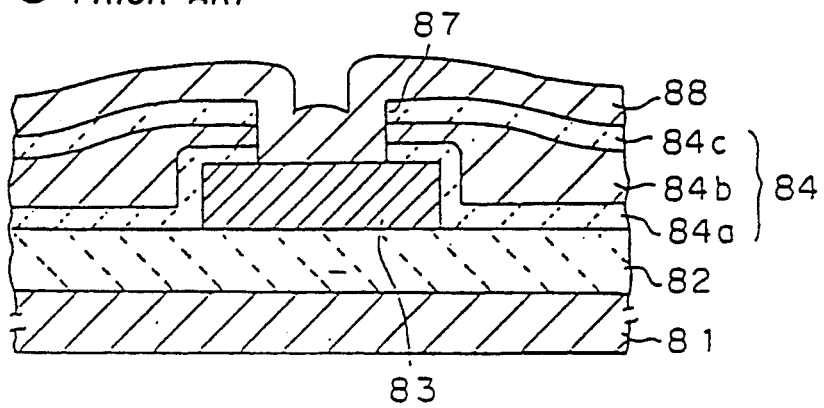

FIGS. 1A to 1C are diagrams for illustrating one example of the conventional process for the production of a semiconductor device. In FIGS. 1A to 1C, 81 designates a substrate comprising Si or the like, 82 an insulating film comprising $SiO_2$ or the like, 83 a wiring layer comprising Al or the like, 84a an $SiO_2$ film, 84b an SOG film, 84c an $SiO_2$ film, 84 the composite insulation film layer comprising the $SiO_2$ film 84a, the SOG film 84b, and the $SiO_2$ film 84c, 85 a resist pattern, 86 an opening, or window, formed in the resist pattern 85, 87 a contact hole serving as a through hole formed in the resist pattern 85, and 88 a wiring layer comprising Al or the like.

The production process will now be described.

At the outset, as shown in FIG. 1A, $SiO_2$ is deposited on a substrate 81, for example, by CVD to form an insulating film 82, Al is deposited on the insulating film 82, for example by sputtering to form an Al film, the Al film is patterned, for example, by RIE to form a wiring layer 83, and an $SiO_2$ film 84a is formed so as to cover the wiring layer 83. At that time, a step is formed on the surface of the $SiO_2$ film 84a. Then, SOG is coated on the $SiO_2$ film 84a by spin coating so as to make the surface level, thereby forming the SOG film 84b, $SiO_2$ is deposited on the SOG film 84b, for example, by CVD to form the $SiO_2$ film 84c, and a resist pattern 85 having the opening 86 is then formed on the $SiO_2$ film 84c.

As shown in FIG. 1B, the interlayer insulation film 84 is etched through the use of a resist pattern 85 as a mask to form a contact hole 87, thereby exposing the wiring layer 83.

Then, Al is deposited, for example by sputtering, so that Al comes into contact with the wiring layer 83 through the contact hole 87, thereby forming a wiring structure as shown in FIG. 1c.

In the above-described conventional process for the production of a semiconductor device, when an inorganic SOG agent (which does not cause organic groups, such as $CH_3$ groups, to be retained in the film after curing) is used as a material for a silica glass film to be formed by the SOG process, a thick film cannot be formed because an increase in the film thickness causes cracking to become liable to occur in the SOG film 84b (cracking is liable to occur particularly when the film thickness is 300 nm or more), so that satisfactory planarization cannot be realized.

Figure 2A:
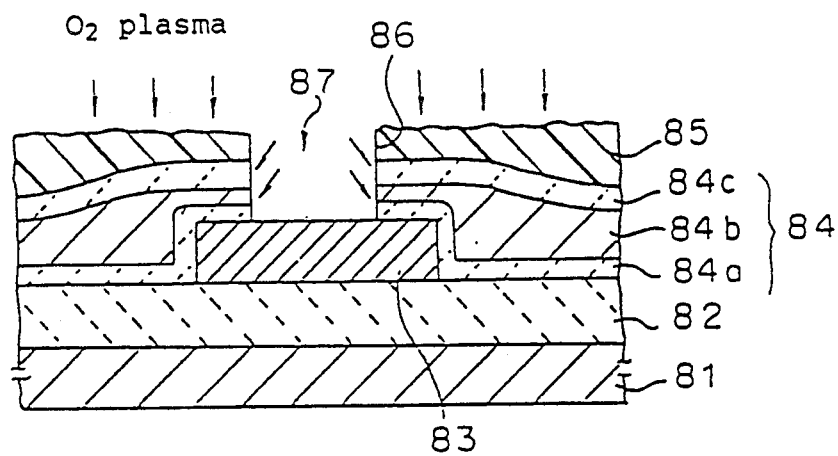
FIGS. 2A and 2B are diagrams for illustrating a problem of the conventional process.
Figure 2B:
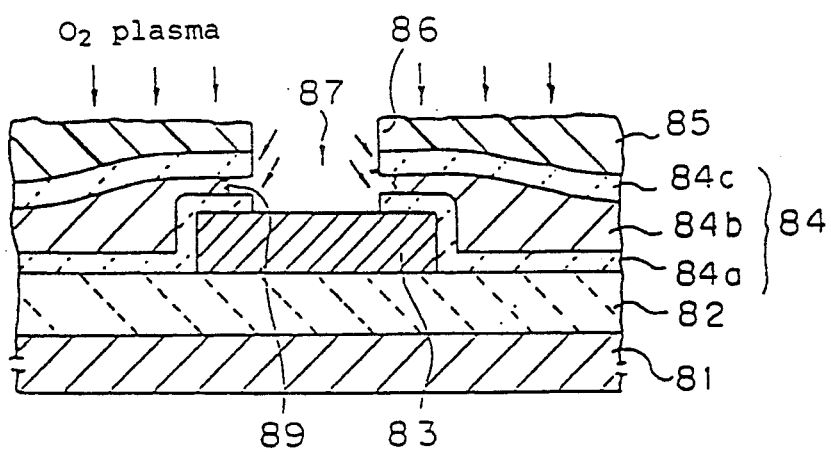

On the other hand, in an organic SOG material (which causes organic groups, such as $CH_3$ groups, to be retained in the film after curing), although it is possible to increase the film thickness (e.g., the formation of a film having a thickness of about 500 to 600 nm is possible), since organic groups, such as $CH_3$ groups, are present in the SOG film 84b, as shown in FIGS. 2A and 2B, when the formed film is exposed to an $O_2$ plasma or an oxygen atmosphere at a high temperature in the subsequent step, the organic groups are subject to oxidative destruction. This causes the film to rapidly shrink, so that there occur problems such as the occurrence of cracking or peeling 89 in the SOG film 84b and a remarkable increase in the hygroscopicity.

Figure 3A:
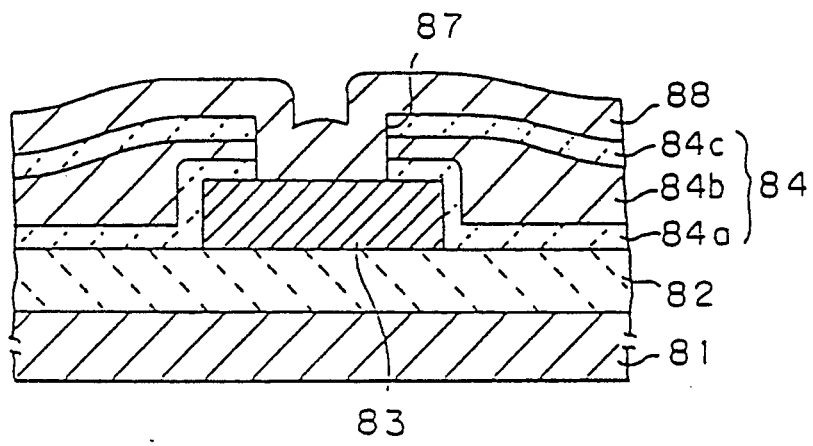
FIGS. 3A and 3B are diagrams for illustrating a problem of the conventional, process.
Figure 3B:
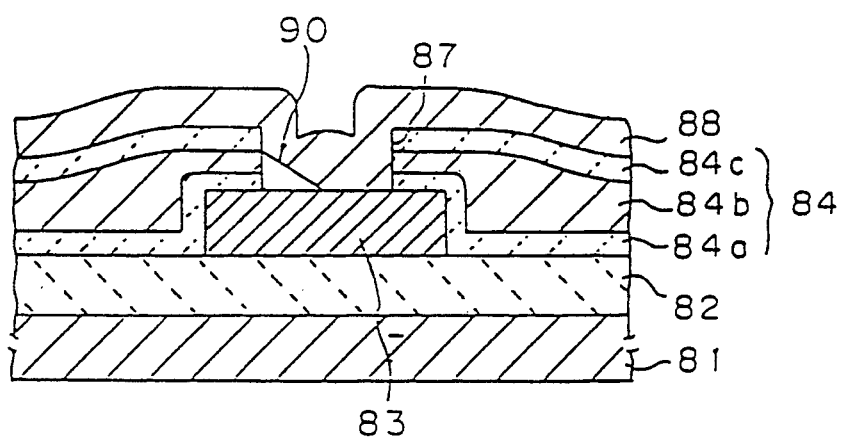

When use is made of an organic SOG material, as shown in FIGS. 3A and 3B, degassing from within the SOG film 84b occurs, which often gives rise to a contact failure 90.

For this reason, when use is made of an organic SOG material, as shown in FIGS. 4A, 4B, 4C, 4D, 4E and 4F, the SOG film 84b is etched-back so that the SOG film 84b is not exposed on the side wall of the contact hole 87 after the formation of a contact hole 87 (a through hole).

Figure 4A:
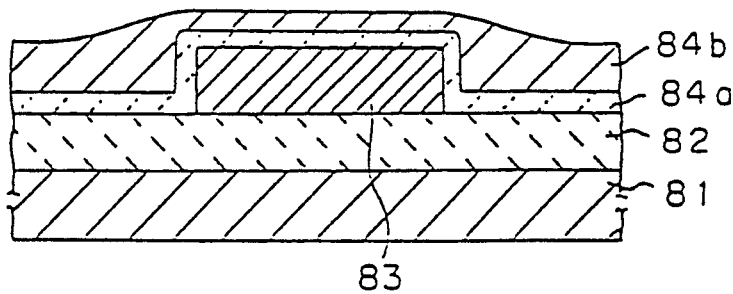
FIGS. 4A, 4B, 4C, 4D, 4E and 4F are diagrams for illustrating another example of the conventional process.
Figure 4B:
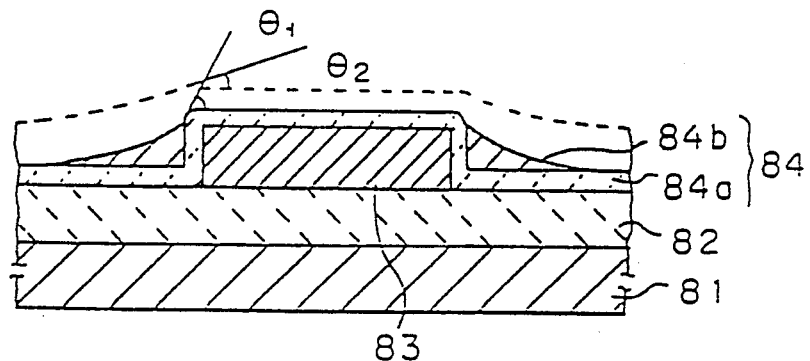
Figure 4C:
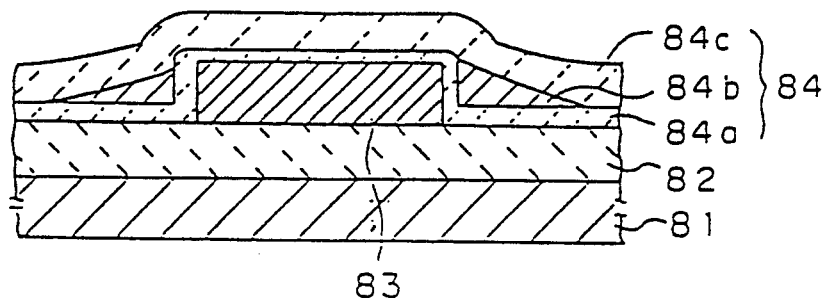
Figure 4D:
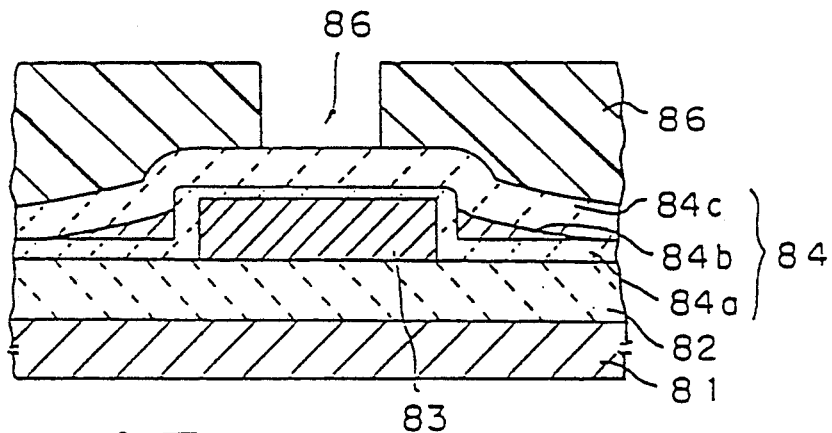
Figure 4E:
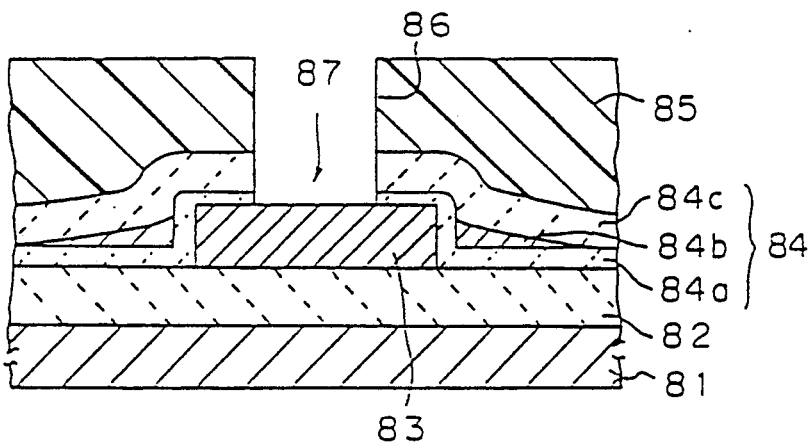
Figure 4F:
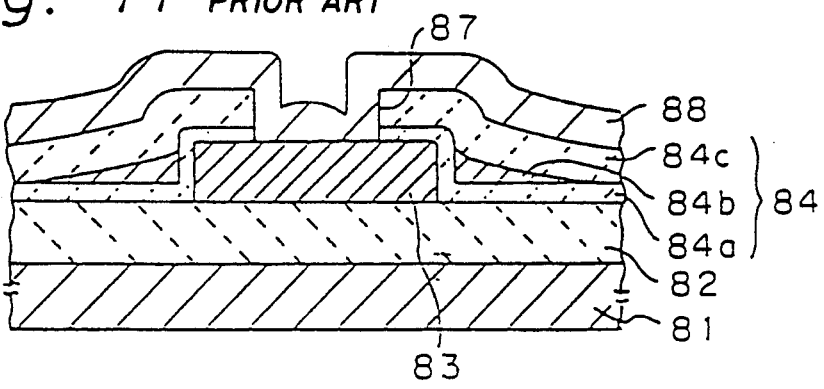

However, when an organic SOG material is used, a step of etch-backing should be additionally provided and the angle $\theta 1$ becomes smaller than $\theta 2$ as shown in FIG. 4B, that is, the flatness after etch-backing becomes inferior to that of the coating, which gives rise to a problem that good planarization cannot be attained due to a problem of the selection ratio of etching.

Examples of conventional means for planarizing the surface other than the SOG process include a method wherein an $SiO_2$ film, a PSG film, or other film, in a conformal or reflow form, is formed by an atmospheric pressure CVD process wherein use is made of TEOS and $O_3$, thereby reducing the step of the surface of the semiconductor device.

In this case, however, when the film thickness is 500 nm or more, cracking occurs in subsequent steps such as heat treatment. On the other hand, when the film thickness is 500 nm or less, there occurs a problem that a flatness comparable to that attained by SOG cannot be attained by the use of this process alone. In order to realize a flatness comparable to that attained by the SOG, it is necessary to form a film having a thickness of 1 $\mu$m or more and to conduct etch-backing (i.e., a step of etch-backing should be additionally provided).

Further, a proposal has been made of a process for the formation of an $SiO_2$ film wherein an $SiO_2$ film is formed in a single stage by a CVD process through the use of a silicon alcoholate, tetraethoxysilane, as a starting compound gas and 0.05 to 5% of steam and 5 to 90% of hydrogen (see Japanese Unexamined Patent Publication (Kokai) No. 2-285636). Although the purpose of this process is to completely convert a silicon alcoholate as a starting compound to $SiO_2$ by means of a hydrogen plasma, there is a description to the effect that a small amount of steam plasma as well is allowed to exist to form an $Si(OH)_4$ component, thereby facilitating the movement of the $SiO_2$ component on the growth surface of the film, thus causing the denseness of the film to be increased.

In this process, however, since an inorganic $SiO_2$ film is directly deposited by $H_2$ plasma CVD, the planarization of the film cannot be realized, so that the problem that an increase in the film thickness leads to cracking remains unsolved.

On the other hand, in an interlayer insulation film for polycrystalline silicon wiring provided under Al wiring wherein a process is practiced at a relatively high temperature, examples of the process for the formation thereof known in the art include one wherein $PH_3$ is added to $SiH_4$ and $O_2$ (or $N_2O$) to form PSG, one wherein $B_2H_6$ is added to $SiH_4$ and $O_2$ (or $N_2O$) to form BSG, one wherein $AsH_3$ is added to $SiH_4$ and $O_2$ (or $N_2O$) to form AsSb, and one wherein $PH_3$ and $B_2H_6$ are simultaneously added to form BPSG. In this case, the flatness is improved by subjecting the film to annealing (reflow) treatment at a high temperature of 900° C. or above.

In a process wherein the flatness is improved by an annealing treatment at a high temperature, since the annealing treatment is conducted at a high temperature of 900° C. or above, the diffusion layer (particularly a source-drain on Pch (i.e., p-type channel) side) is unfavorably redistributed, so that the source-drain breakdown voltage of a transistor falls due to the occurrence of punch-through.

FIGS. 5A and 5B are diagrams for illustrating the principle of the present invention. FIG. 5B shows a process for forming a thin film of silicon oxide according to the present invention. For comparison, the conventional SOG process is shown in FIG. 5A.

In the conventional SOG process shown in FIG. 5A, use is made of chemical polymerization, which is one of the sol-gel processes. In this process, a silicon alkoxide ($Si(OR)_4$ or the like wherein O represents an oxygen atom and R represents an alkyl group) and $H_2O$ are mixed with a solvent such as butyl cellosolve or propylene glycol monopropyl ether, and a suitable amount of an acid catalyst, such as $HNO_3$, $HCl$, or $H_2SO_4$, is mixed therewith for the purpose of controlling an hydrolysis reaction and a dehydration condensation reaction.

On the other hand, in the present invention, an organic silane (or an organic siloxane) and $H_2O$ are excited, instead of using the acid catalyst. Examples of the excitation method include plasma excitation (RF discharge, $\mu$-wave discharge, low-frequency discharge, direct current glow discharge, etc.), light excitation (IR, UV, SOR, laser, X-ray, etc.), thermal excitation, etc. Further, if necessary, use may be made of pulsed excitation wherein the excitation is timely turned on and off.

As with the SOG process, in the present invention, a filmy gel comprising a low-molecular weight polymer containing organic groups is deposited on the substrate. The filmy gel has fluidity, and the film can be leveled to the equivalent extent as that immediately after SOG coating. Thereafter, an undesirable organic group is removed from the leveled film. In the process of the present invention, the reaction and deposition processes can be widely controlled by varying parameters such as the excitation energy (power, pulse cycle, duty, etc.), pressure, temperature, flow rate, etc. Further, since both a plasma treatment and a heat treatment can be incorporated in said deposition process, it becomes possible to increase the film thickness while maintaining the flatness and good film quality.

In an embodiment most relevant to the SOG process, after the organic-group-containing silicon oxide film is deposited, the formed film may be heat-treated to remove the organic groups, thereby causing the organic-group-containing silicon oxide film to be converted to a silicon oxide film. In this embodiment, since the control of the film thickness is easily achieved as compared with the SOG process, the film can be thinly formed and baked or cured. Since organic groups are contained in the film, when a thick film is formed at one time and heat treated, cracking occurs due to the occurrence of a large stress derived from film shrinkage. This embodiment, however, is advantageous in that when a film is formed while controlling the film thickness to a small value, the occurrence of the stress can be minimized and a repetition of the formation of a thin film and the heat treatment enables the film thickness to be increased. Further, the formation of a film and the heat treatment can be conducted in an identical (i.e., the same) vacuum chamber, which facilitates the above-described repeated treatment.

According to a second embodiment, baking or curing can be conducted while conducting the deposition when the deposition is conducted while heating the substrate from the beginning. Further, the planarization can be maintained by controlling the substrate temperature etc. to regulate the degree of baking or curing.

According to a third embodiment, the deposition of an organic-group-containing silicon oxide becomes possible at a higher temperature through the modification of the second embodiment, that is, through the excitation of the gas in a pulsed manner. This makes it possible to establish a film forming process wherein the deposition, flow, and baking or curing are controlled at intervals of a short period on time of the order of the pulse time.

According to a fourth embodiment, an $SiO_2$ film, which is flat, is converted to an inorganic material and has a good quality, can be formed so as to have a desired film thickness by conducting baking or curing through a plasma treatment and alternately repeating the deposition and the plasma treatment in an identical (i.e., the same) reaction chamber without breaking the vacuum. In the formation of an inorganic $SiO_2$ film by the conventional CVD process or plasma CVD process, since the deposited film has no fluidity, the planarization cannot be attained and which, by contrast renders the present embodiment very useful.

In the second to fourth embodiments, in the relationship with the temperature employed heating the substrate, if necessary, the film may be further heat-treated at a high temperature to make the film dense or to remove the remaining organic groups. It is also possible to utilize heat treatment for the reflow.

The starting compound gas used in the process of the present invention is an organosilane or an organosiloxane and a compound containing H and OH.

The organosilane or organosiloxane is a compound wherein the basic atom or basic skeleton comprises Si or Si-O and all the side groups each comprise organic groups (an alkyl group such as methane or ethane, an alkoxyl group such as a methoxy group, an ethoxy group, an acetoxyl group, an aryl group, or the like), and examples of the starting compound gas include tetraethoxysilane, tetramethoxysilane, tetramethylsilane, tetramethylcyclotetrasiloxane, octomethylcyclotetrasiloxane, and diacetoxy-di-tertbutoxysilane. In this case, part of the organic groups may be substituted, for example, by a halogen, a hydrogen atom, a hydroxyl group, an NH (ammonia) group, and an $NO_3$ group.

It is preferred that the organosilane or organosiloxane have a molecular weight in the range of from 50 to 5000, still preferably 100 to 1000, the number of carbon atoms be 50 times or less, still preferably 20 times or less, the number of silicon atoms contained therein, and all or substantially all the Si-bonded groups be in alkoxyl groups.

In the present invention, the thin film of silicon oxide may be doped with an impurity such as phosphorus (P), boron (B), or arsenic (As) to form PSG, BSG, AsSG, BPSG, or the like. A phosphorus alkoxide such as $P(OCH_3)_3$ or $PO(OCH_3)_3$ is simultaneously added as a source gas of P, a boron alkoxide such as $B(OCH_3)_3$ or $B(OC_2H_5)_3$ is simultaneously added as a source gas of B, and an arsenic alkoxide such as $As(OCH_3)_3$ is simultaneously added as a source gas of As. Since the fundamental concept of the reaction is quite the same as that of the alkoxide similar to TEOS, the film can be effectively doped with P, B, and As.

The compound containing H and OH is a compound which generates H and OH radicals, or H and OH ions, upon being excited. The compound is preferably one which generates no radicals or ions other than H and OH radicals or ions. Therefore, $H_2O$ and $H_2O_2$ (hydrogen peroxide) are preferred. However, note that the occurrence of radicals or ions other than H and OH radicals or ions is not excluded from the present invention.

In the present invention, a thin film of silicon nitride oxide may be formed by simultaneously using a gas ($NH_3$ or the like) containing N (nitrogen) to effectively dope the thin film with N. The formation of a thin film of silicon nitride oxide contributes to an improvement in the moisture resistance and water permeability of the thin film over the thin film of silicon oxide and enables a thin film having a high reliability to be formed.

As described above, in the present invention, the organic groups remaining in a low-molecular weight polymer or the formed thin film can be effectively removed by oxidative destruction through simultaneous use of $O_2$ gas (oxygen gas) to form a thin film of silicon oxide having a high reliability. The introduction of $O_2$ gas may be conducted in a continuous or intermittent manner. The intermittent introduction is preferred from the viewpoint of regulating the molecular weight.

Further, a suitable amount of a gas less contributable to the reaction, such as an inert gas (Ne, Ar, or the like), may be mixed as a carrier gas. This enables the reaction of the organosilane gas with a gas of a compound containing H and OH, such as $H_2O$, to be controlled and, at the same time, the molecular weight of a low-molecular weight polymer polymerized to be regulated. This makes it possible to form a thin film having an excellent flatness on a wafer.

In the present invention, the molecular weight of the polymer formed by the reaction and the state of the thin film of silicon oxide formed on the wafer vary depending upon the flow rate ratio of the $H_2O$ gas to the organosilane or organosiloxane gas.

The flow rate ratio of the $H_2O$ gas to the organosilane or organosiloxane gas is preferably 1/10 to 50 times the stoichiometric molar ratio (for example, in the case of TEOS and $H_2O$, the amount of $H_2O$ is 4 mol based on one mol of TEOS, and in the case of HMDS and $H_2O$, the amount of $H_2O$ is 6 mol based on one mol of HMDS) in the case where the organosilane or organosiloxane material is hydrolyzed or oxidized through the use of $H_2O$ because it is possible to form a thin film of an organic-group-containing silicon oxide having an excellent surface flatness and high reliability. The flow rate ratio is still preferably in the range of $\frac{1}{2}$ to 2 times, particularly preferably about one time, that is, substantially the stoichiometric ratio.

In order to react an organosilane or an organosiloxane with a compound containing H and OH, such as $H_2O$, to form a polymer, it is necessary to excite the gas. Examples of the excitation method include one wherein high-frequency power is supplied, one wherein light energy is supplied, one wherein thermal energy is supplied, and one wherein use is made of a catalyst capable of chemically amplifying the reaction. The term "excitation" used herein is intended to mean that activation is conducted by applying energy from the outside to decompose an organosilane or an organosiloxane or a compound containing H and OH, such as $H_2O$, to an atomic level or to bring a ground energy state, on an atomic or molecular level into a higher energy state (excited state). For example, in the case of $H_2O$, the excitation is to bring $H_2O$ into such a state that an $H_2O$ radical, H radical, OH radical, H ion, OH ion, electrons, etc. are formed.

A reaction of an organosilane or an organosiloxane with a compound containing H and OH will now be described by taking a reaction of $Si(OEt)_4$ with water ($H_2O$) as an example. The reaction of tetraethoxysilane with water is stoichiometrically represented by the following formula:

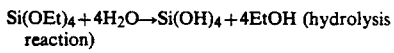

$Si(OEt)_4 + 4H_2O \rightarrow Si(OH)_4 + 4EtOH$ (hydrolysis reaction)

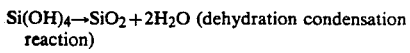

$Si(OH)_4 \rightarrow SiO_2 + 2H_2O$ (dehydration condensation reaction)

However, when the above-described reaction proceeds to completion, an inorganic $SiO_2$ film is deposited, and the deposited film has no fluidity and therefore cannot be planarized.

For this reason, in the present invention, $Si(OEt)_4$ is reacted with $H_2O$ under such a condition that the hydrolysis of $Si(OEt)_4$ and the dehydration condensation of the product obtained by the hydrolysis do not proceed to completion. A simplified example of the reaction will be described for the purpose of showing this state.

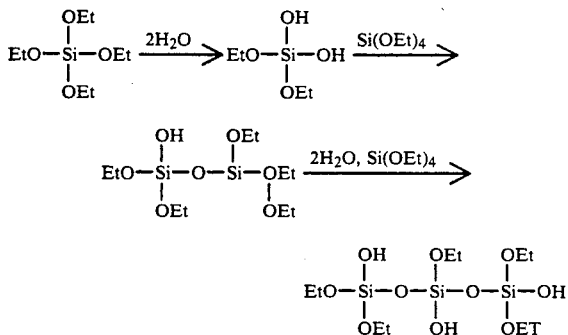

As is apparent from the above formula, $Si(OEt)_4$ is oligomerized (low-molecular weight polymer). In this case, all the OEt's as the side group are not always converted to OH groups, and the OEt substantially remains in the product to continue the reaction. The product thus obtained is not a homogeneous compound and is considered to be an aggregate of compounds polymerized and hydrolyzed to various extents. Therefore, although the compound cannot be simply represented, an example of the compound is as shown in FIG. 6A.

Therefore, the low-molecular weight polymer can be regarded as a low-molecular weight polymer of silicon oxide having a siloxane bond (-Si-O-Si-). In the case of an unreacted organic group (TEOS), however, ethoxy groups ($OC_2H_5$ or the like) still remain in the interior thereof, and the terminal bond of the low polymer is considered to be capped with not only OH but also an organic group (an ethoxy group ($OC_2H_5$) or the like in the case of TEOS). Like the compound shown in FIG. 6B, when a silanol wherein all the groups are substituted with OH groups is produced, it is liable to easily give rise to a dehydration condensation reaction. Therefore, as soon as such a compound reaches the substrate, it is crosslinked to a thin film formed on the substrate, which remarkably deteriorates the fluidity (migration).

Thus, when a silanol polymer wherein all the groups are substituted with OH groups, or a polymer wherein most of the groups, are substituted with OH groups is produced as in the compound shown in FIG. 6B, in order to realize the fluidity, it is necessary to lower the rate of the crosslinking reaction on the substrate. Lowering the wafer substrate temperature is considered useful for this purpose. This is because lowering the wafer substrate temperature causes the rate of crosslinking reaction on the substrate to be lowered. In this case, the wafer substrate temperature is preferably 100° C. or lower, preferably room temperature (25° C.) or below.

When an organic group is present as in a compound shown in FIG. 6A, it is possible to realize the deposition of a flat thin film even at room temperature or above, for example at, 100° C. or above.

Therefore, when the low-molecular weight polymer is adsorbed by the wafer, not only the molecular weight of the low polymer but also the bonded state has a significant influence on the fluidity and crosslinking reaction on the surface of silicon oxide.

Thus, the silicon oxide film deposited on the substrate according to the present invention has at least an organic group and is of a suitable molecular weight which enables the thin film to be flattened. Although the content and molecular weight of the organic group cannot be simply described, it is necessary for at least the surface of the formed thin film to have a flatness to such an extent that a surface discontinuity does not develop even in a surface portion having a step.

The amount of the organic groups contained in the above-described thin film of silicon oxide having a desired flatness is preferably as small as possible, so far as the planarization is possible (that is, it is possible to realize a planarized shape). As described above, the amount of the organic group remaining in the film has a mutual relationship with the wafer substrate temperature for the purpose of realizing a planarized shape. In general, when a film is formed at room temperature or above, the organic group remains in an amount of 90% by weight or less, still preferably 20 to 60% by weight at the time of deposition, particularly at 100° C. or above. Further, in general, when the film is formed at room temperature or below, the residual amount of the organic group is controlled to 30% by weight at the largest, still preferably 10% or less by weight.

The low-molecular weight polymer adsorbed on a wafer receives heat from the wafer, accompanying an increase in the wafer temperature, which accelerates the polymerization (crosslinking) reaction. As described above, the Si-OH bond gives rise to a crosslinking reaction through a dehydration condensation reaction, thereby causing the Si-OH bond to be converted to a silicon oxide having a siloxane bond (-Si-O-Si-).

However, as described above, organic groups remain within or on the surface of the low polymer. With respect to the bond linked to the organic groups as well, the frequency of the crosslinking reaction varies depending upon the temperature. For example, in the case of a $Si-O-C_2H_5$ bond, the decomposition of the organic groups occur at a temperature in the range of from about 250° to 300° C. or above. This is because a dangling bond such as Si-O- is formed which accelerates the crosslinking reaction.

Further, the step of removing organic groups from the thin film in the present invention is not limited to the above-described plasma treatment and redox treatment and instead can be practiced simply by heat treatment.

The temperature of the heat treatment for removing the organic groups is generally 100° C. or above, still preferably 250° C. or above. According to the present invention, since the organic groups can be removed at a low temperature of 450° C. or below to form a thin film of silicon oxide, this treatment quite favorably, has no adverse effect on the aluminum wiring. The thin film of a silicon oxide from which the organic groups have been removed by a heat treatment at a relatively low temperature exhibits a relatively large etching rate. The reason for this is believed to reside in that the formation of a network structure (a three-dimensional structure) of silicon oxide is unsatisfactory and there exist many dangling bonds. Therefore, the heat treatment may be conducted at a temperature of 600° C. or above, preferably 850° C. or below.

According to the above-described plasma treatment, it is possible to form a network structure of a thin film at a temperature of 450° C. or below, for example even at room temperature. However, as described above, when use is made of an embodiment wherein the deposition and the plasma treatment are repeated within an identical (i.e., the same) reaction chamber, the temperature is preferably 250° C. or below from the viewpoint of the planarization at the time of deposition, and 100° C. or above from the viewpoint of the effect of the plasma treatment. Therefore, it is preferred to form a network structure of a silicon oxide film and to increase the denseness of the film through a plasma treatment at 100° to 250° C., preferably followed by a heat treatment at 250° to 450° C.

Further, if necessary, the film may be reflowed by a heat treatment at a high temperature to form a film having a higher degree of flatness. In this case, the film may be doped with P, B, As, or the like to lower the reflow temperature. According to the present invention, since the reflow is not indispensable, a satisfactory effect can be attained at a reflow temperature of 850° C. or below, even at 800° C. or below.

In the present invention, a thin film of an organic-group-containing silicon oxide is formed on a wafer by exciting a gas of an organosilane or organosiloxane gas, such as TEOS, and a gas of a compound containing H and OH, such as H$_2$O, in a gaseous phase to give rise to a hydrolysis or oxidation reaction either in a gaseous phase or on the surface of a wafer, to form a silanol or its low polymer or a low polymer having a siloxane bond, either in a gaseous phase or on the surface of the wafer, and adsorbing the low polymer as an intermediate product on the wafer. In the intermediate product of the low polymer formed by the excitation reaction, when the degree of polymerization is smaller (that is, the molecular weight is lower), the state more distinctly changes at room temperature as follows: solid→liquid→gas. Further, the lower the degree of polymerization of the low polymer, the larger the vapor pressure.

Therefore, when a thin film of a silicon oxide having an excellent surface flatness and a high reliability is formed by the above-described process, the wafer temperature is a very important factor for adsorbing a polymer having a low molecular weight on the wafer, flowing the low polymer on the wafer, and accelerating the crosslinking reaction. The wafer temperature is determined by taking these matters into consideration.

In particular, in a preferred embodiment of the present invention, when the deposition of a thin film of an organic-group-containing silicon oxide is conducted in combination with a plasma treatment for removing organic groups from the thin film and they are repeated in an identical (i.e., the same) reaction chamber, it is preferred that the substrate temperature be allowed to coincide with the temperature necessary for the plasma treatment (i.e., for the removal of the organic groups). In this case, for example, when the deposition is conducted while heating at 100° to 250° C., it is necessary to form a thin film having a desired fluidity (flattening capability) through the control of other process conditions. In this case, it is particularly useful to conduct the excitation in a pulsing, or pulsed, manner. Specifically, intermittent excitation enables a thin film having a fluidity to be deposited even at a high temperature.

Thus, a thin film can be converted to silicon oxide by thinly forming an organic-group-containing silicon oxide film having an even surface at a high temperature and subjecting the thin film to a plasma treatment at the same temperature to remove organic groups from the thin film. The plasma treatment can be conducted by stopping the supply of an organosilane or organosiloxane gas as a starting compound gas and generating a plasma through the use of a compound containing H and OH or the introduction of other gases such as O$_2$, H$_2$, etc. The organic group is removed by an oxidation reaction or a reduction reaction. The repetition of the alternating steps of the deposition of an organic-group-containing silicon oxide film and the plasma treatment makes it possible to form a planar silicon oxide film wherein the occurrence of cracking, attributable to large shrinkage, has been prevented. Therefore, the process of the invention renders it possible to form an insulating film which has an excellent flatness, the process enables the thickness of the film to be increased, and the resulting film has a high reliability.

In general, the above procedure wherein a thin film is deposited to a thickness of 100 nm or less that is, the upper limit of the depth treatable by means of a plasma is preferably a thickness of 10 nm or less from the viewpoint of the shrinkage—and is exposed to a plasma for about 5 to 60 sec, preferably about 20 to 30 sec, is repeated.

In the above embodiment, although the deposition of an organic-group-containing silicon oxide film and the plasma treatment are alternately repeated within an identical (i.e., the same) reaction chamber, the present invention is not limited to this embodiment only. Specifically, after the deposition of an organic-group-containing silicon oxide film, it is generally possible to use a plasma treatment and a redox treatment for the purpose of removing organic groups, and there is no need for the reaction chamber, temperature, etc. to be identical.

Figure 7:
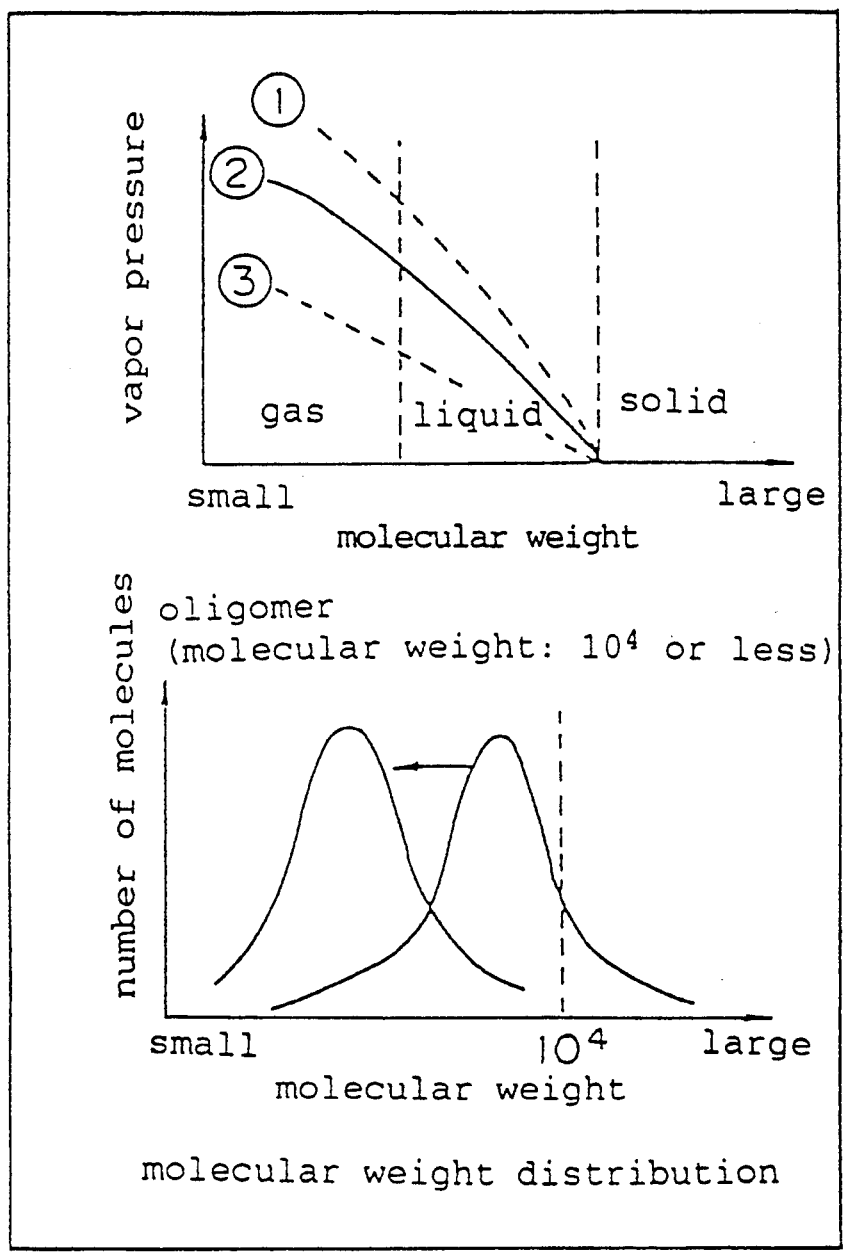
FIG. 7 is a diagram showing a molecular weight distribution in terms of the relationship between the molecular weight distribution and the vapor pressure of the polymer and the number of adsorbed molecules for illustrating the present invention.

As described above, the possibility of the adsorption of an intermediate product of a low polymer on a wafer by the pressure within a chamber containing a wafer therein varies depending upon the molecular weight (see FIG. 5). In FIG. 7, the upper drawing shows the dependency of the vapor pressure of the polymer upon the molecular weight and the temperature, while the lower drawing schematically shows molecular weight distributions of a gaseous polymer and liquid polymer. In order to form a planar thin film of a silicon oxide on a wafer, it is necessary that an intermediate product having a low molecular weight (at least in a liquid form) be adsorbed on a wafer and allowed to migrate on the wafer. Therefore, the pressure within the chamber in which the wafer is placed is an important factor and should be at least 1 Torr or more. When plasma excitation by means of high-frequency discharge is used, the pressure is preferably 5 to 15 Torr, particularly preferably 5 to 10 Torr, from the viewpoint of the stability of the plasma excitation.

Further, in the present invention, when an organosilane or an organosiloxane and a compound containing H and OH, such as $H_2O$, are excited and reacted with each other to form a low-molecular weight polymer and the low polymer is adsorbed on a wafer to form a thin film of silicon oxide, as described above, the molecular weight of the polymer formed by the excitation is very important to the formation of a planar thin film of an organic-group-containing silicon oxide on the wafer, so that a method of regulating the molecular weight is important. The excitation of the gas in a pulsing manner is useful for regulating the molecular weight.

The molecular weight of the polymer formed by the reaction may be regulated through the occurrence of excitation energy or the acceleration of the excitation by means of intermittent pulses. According to this method, it is possible to form a polymer having a low molecular weight, and the adsorption of the polymer on the wafer enables a thin film of an organic-group-containing silicon oxide having an excellent flatness to be formed.

In the present invention, examples of the gas used for excitation include a gas consisting of an organosilane- or organosiloxane-containing gas, alone, a gas consisting of an H- and OH-containing compound gas, such as $H_2O$, and a mixed gas comprising these gases. The selection of the gas can be properly determined by the regulation of the molecular weight of a polymer formed on the surface of a wafer, ease of use of the apparatus, ease of practice of the process, etc.

In the present invention, the state of the thin film of a silicon oxide having organic groups formed on a wafer varies, depending upon the temperature of the wafer on which a polymer is adsorbed. As described above, the vapor pressure of the polymer increases along with a decrease in the molecular weight of the polymer. It is a matter of course that the vapor pressure of the polymer varies depending also upon the temperature at which the polymer is placed, and the vapor pressure increases along with an increase of the temperature.

Therefore, under constant pressure, the probability of the adsorption of the polymer on the wafer at a function of the temperature of the wafer varies depending upon the molecular weight of the polymer, and in a polymer having a low molecular weight, the vapor pressure increases along with an increase of the temperature of the wafer. The reason for this is that the lower the molecular weight, the lower the probability of the adsorption of the polymer on the wafer (see FIG. 6A).

The low polymer adsorbed on the wafer flows (migrates) on the surface of the thin film of an organic-group-containing silicon oxide formed on the wafer and is converted to a thin film of an organic-group-containing silicon oxide while crosslinking with a dangling bond on the surface of the organic-group-containing silicon oxide. The flatness of the thin film of an organic-group-containing silicon oxide is attained by virtue of the fluidity of the low polymer on the surface of the thin film.

As described above, the probability of the adsorption of a low-molecular weight polymer on the wafer increases when decreasing the wafer temperature, which contributes to an improvement in the flatness of the formed thin film of an organic-group-containing silicon oxide. In this case, however, the frequency of crosslinking on the surface of the organic-group-containing silicon oxide falls (i.e., reduces).

The following treatment conditions are one example of the case where use is made of a diode parallel-plate plasma CVD system as one embodiment of the present invention.

Temperature: room temperature to 250° C.
Pressure: 5 to 15 Torr, particularly 10 Torr
Distance between electrodes: 6 to 25 mm, particularly 10 mm
Gas flow rate: 100 to 18000 cm$^3$/min
Discharge power: 500 W or less, particularly 100 to 400 W
RF (discharge) frequency: 13.56 MHz
Pulse frequency (period): 100 times or less, preferably 10 times or less the time required for the reaction gas to pass through, between the electrodes of the diode parallel plates (for example, time of access between electrodes: 1/70 sec in FIG. 13)

$$\text{Discharge duty cycle: } D \leq \{140 - (140/310)T\} \frac{300}{P}$$

wherein T represents a substrate temperature, P represents an RF power (W:watt), provided that when the D value is 100% or more, it is regarded as 100%.

The term "discharge duty cycle" used herein is intended to mean the proportion of the "on" time to the total pulse period.

In the present invention, the embodiment wherein use is made of an unsubstituted organosilane is applicable also to an embodiment wherein, for example, $SiX(OC_2H_5)_3$ is used instead of TEOS ($Si(OC_2H_5)_4$, or $X(CH_3)_2SiOSiX(CH_3)_2$) is used instead of HMDS ($(CH_3)_3SiOSi(CH_3)_3$), that is, an organosilane having an organic group (in this case, an ethoxy group ($OC_2H_5$) and a methyl group ($CH_3$)) substituted with another element (X) is used as the organosilane or organosiloxane. Such other element X may be H (hydrogen), Cl (chlorine), F (fluorine), or any of various other elements.

In this case, the bonding strength between Si in an excited state and the above substituted element (in this case, X) is very important. Specifically, also in the excitation reaction in a gas of a compound containing H and OH (for example, $H_2O$ gas), when the element (in this case, X) does not react, it is a matter of course that the unreacted element is incorporated also into a thin film of silicon oxide formed on the wafer. Consequently, this naturally causes the amount of the organic groups remaining in the thin film of silicon oxide, such as alkoxy groups and alkyl groups, to be reduced. Therefore, if the element (X) is stable also in subsequent steps, such as an annealing treatment and a plasma treatment, it is possible to improve the film quality of the film, such as its cracking resistance, so the use of elements or groups capable of meeting this requirement is preferred.

In the present invention, the adsorption of a low polymer occurs not only on the wafer but also in portions of other structures exposed to a reaction gas, such as the chamber of the film forming device and the electrodes, depending upon the temperature. In order to prevent the change in the growth rate of silicon oxide on the wafer and to prevent the occurrence of staining and deposits of particles on the chamber, electrodes, etc., it is preferred to maintain the temperature of the wafer and portions of other structures exposed to a reaction gas, such as the chamber walls and electrodes and other than the stage on which is positioned the wafer, at a constant value. Further, in this case, it is preferred to maintain the temperature at room temperature or above for the purpose of controlling the probability of the absorption.

In the present invention, organic components are still contained in the formed film, depending upon film forming conditions, so that the organic components are contained also in the chamber, electrodes, etc. In the cleaning of the chamber, not only can the cleaning time be shortened but also the deposits, such as of organic substances, can be completely removed by adding $O_2$ gas to a cleaning gas, such as $NF_3$, or conducting chamber cleaning through the use of a cleaning gas, such as $NF_3$, after exposure to $O_2$ plasma.

In the present invention, it is also possible to store the wafer having a thin film of silicon oxide formed thereon in a chamber having a controlled atmosphere, pressure, and temperature in an identical (i.e., the same) apparatus and to conduct an annealing treatment within a chamber having a controlled atmosphere, pressure, and temperature in an identical (i.e., the same) apparatus when the number of stored wafers has reached a predetermined value or limit.

Further, in the present invention, after the formation of a thin film of a silicon oxide, an etch backing step may be conducted in an identical chamber within an identical apparatus or within another chamber within an identical apparatus. In this case, a F-containing gas, such as $CF_4$, $CHF_3$ or $NF_3$, may be used as a reaction gas for etch backing, optionally after the addition of $O_2$.

Further, according to the present invention, in a planar-type plasma CVD system, it is difficult to obtain a stable plasma discharge under a high pressure of about 10 Torr through the use of low-frequency power (1 MHz or less) alone. However, when the low-frequency power is applied simultaneously with high-frequency power (13.56 MHz), not only can a plasma discharge be stably obtained but also an ion bombardment effect can be attained through the use of a low-frequency discharge, which contributes to an improvement in the quality of the thin film of silicon oxide formed on the wafer.

In the present invention and with respect to the molecular weight of the polymer polymerized in a gaseous phase or on the surface of the wafer, it is possible to vary the molecular weight distribution of the polymer by varying the pulse conditions (i.e., the period, duty cycle, etc.) so far as other conditions are the same. Fundamentally, pulse conditions capable of providing a larger amount of excitation energy enable the molecular weight to be shifted toward a higher polymer side. The higher the molecular weight of the polymer, the smaller the change of weight in the subsequent heat treatment, such as annealing, when the polymer is adsorbed on the wafer and the smaller the degree of shrinkage of the film in terms of the thickness. This contributes to an improvement in the reliability, such as cracking resistance, of the film. However, the flatness of the film decreases when increasing the molecular weight of the polymer, so that the effect of filling up narrow grooves, holes, etc. is lowered. Therefore, when pulse conditions are properly varied during the process (during the formation of a film), it is possible to form a thin film of silicon oxide having an excellent flatness and a high reliability in respect to its cracking resistance, etc.

[EXAMPLE]

First Example

Figure 8:
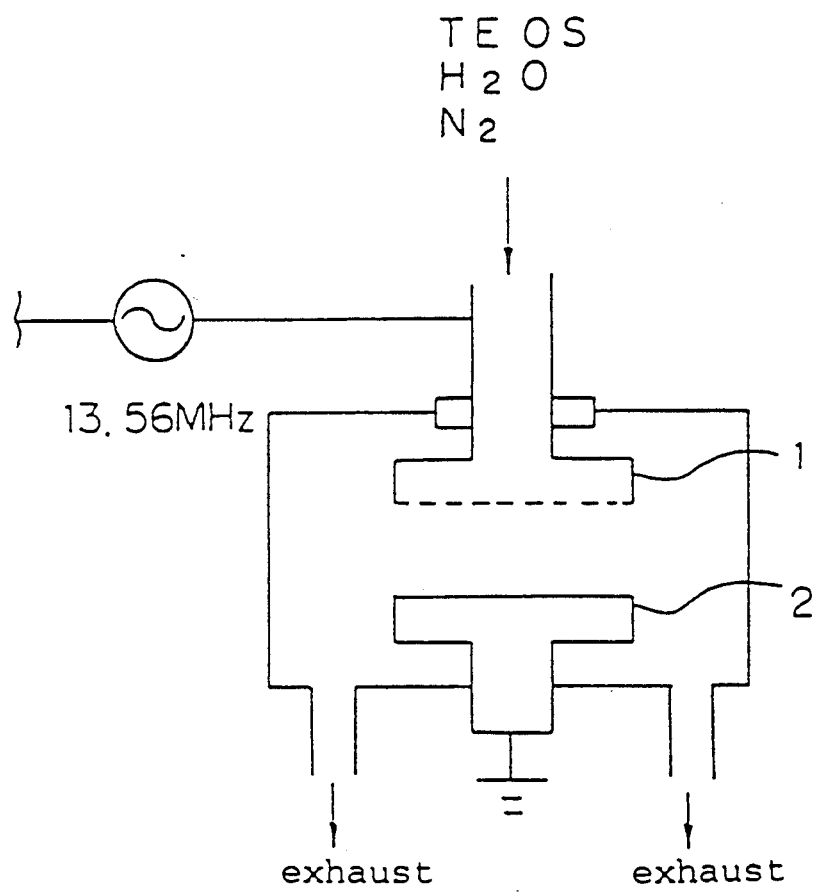
FIG. 8 is a schematic diagram of a plasma CVD device according to the first example of the present invention.

FIG. 8 is a schematic view of an apparatus for practicing embodiments of the present invention, i.e., a planar-type (anode couple) plasma CVD system.

A gas is excited through the use of a high-frequency (RF) discharge between electrodes 1, 2. In this case, the RF frequency is 13.56 MHz.

Both TEOS and $H_2O$ are introduced in the form of vapor by heating a source tank, piping, etc. $N_2$ is used as a carrier gas.

An electrode 1 on the upper cathode side serves also as a port for introduction of these gases into the chamber and is in the form of a shower device. On the other hand, a heating wire for control of the temperature and piping for a chiller are provided within an electrode 2 on the lower anode side, and the temperature can be varied in the range of from $-50°$ C. to $+500°$ C.

At the outset, the pressure dependency and temperature dependency were examined.

Continuous oscillation and excitation were conducted under conditions of a TEOS flow rate of 4 sccm, an $H_2O$ flow rate of 600 sccm (flow rate ratio of 1:150), an RF frequency of 13.56 MHz, and an RF power of 100 W. The distance between electrodes was 18 mm. The water temperature was brought to room temperature, and deposition was initiated. Although the wafer temperature increased due to the RF power as soon as the deposition was initiated, this temperature increase was ignored.

The form of the thin film deposit, comprising silicon oxide, in terms of the dependency of the form of the deposit upon the pressure of the chamber, is shown in FIGS. 9A to 9D. In the drawings, 5 designates a silicon substrate, 6 a thermally oxidized film (thickness:50 nm), 7 a polycrystalline silicon pattern, 8 a CVD-$SiO_2$ film (thickness:50 nm), and 9 a thin film of (organic-group-containing) silicon oxide.

Figure 9A:
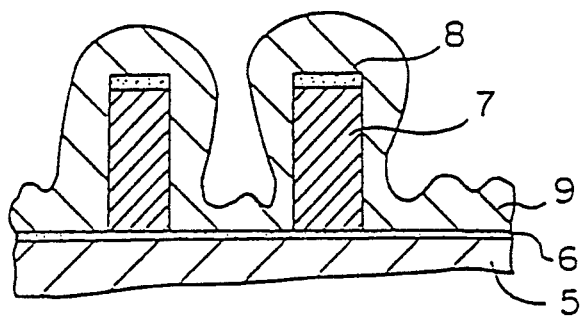
FIGS. 9A, 9B, 9C and 9D are diagrams showing the form of a deposit of a thin film of silicon oxide in terms of the dependency of the form of the deposit upon the pressure.
Figure 9B:
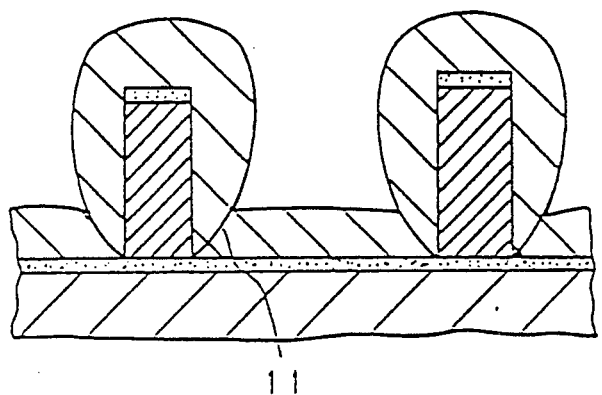
Figure 9C:
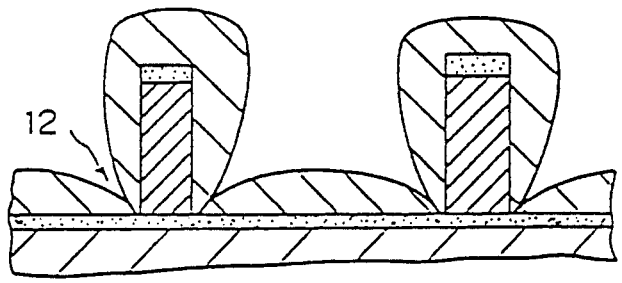
Figure 9D:
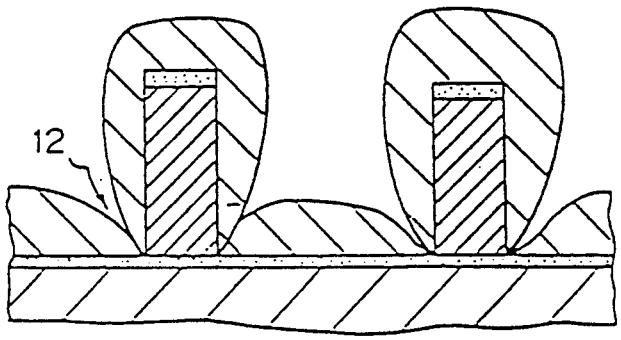

The deposit formed under a pressure of 10 Torr shown in FIG. 9A is in a reflow form although it resembles an octopus trap in its form. When the pressure of the chamber is further reduced, the form changes as shown in FIGS. 9B to 9D. Specifically, the surface of a discontinuity 11, inherent in the CVD film, becomes clearly observed at the edge portion in a step (see FIG. 9B), and a further reduction in the pressure leads to the occurrence of cracking 12 (see FIGS. 9C and 9D).

The above results show that the molecular weight of the polymer adsorbed on the wafer varies depending upon the pressure of the chamber. This is because the lower the molecular weight of the polymer, the higher the liquid fluidity. Thus, it can be estimated that the factor which gives rise to a change in the form is that a polymer having a low molecular weight suitable for exhibiting the fluidity is effectively obtained by means of a plasma under a high pressure of about 10 Torr. Under high pressure (10 Torr), a low-molecular weight polymer having a high vapor pressure can be more successfully adsorbed on the wafer than under low pressure (1 Torr or less). That a reflow form can be obtained by the flow effect of the low-molecular weight polymer on the wafer is considered another factor.

Figure 10:
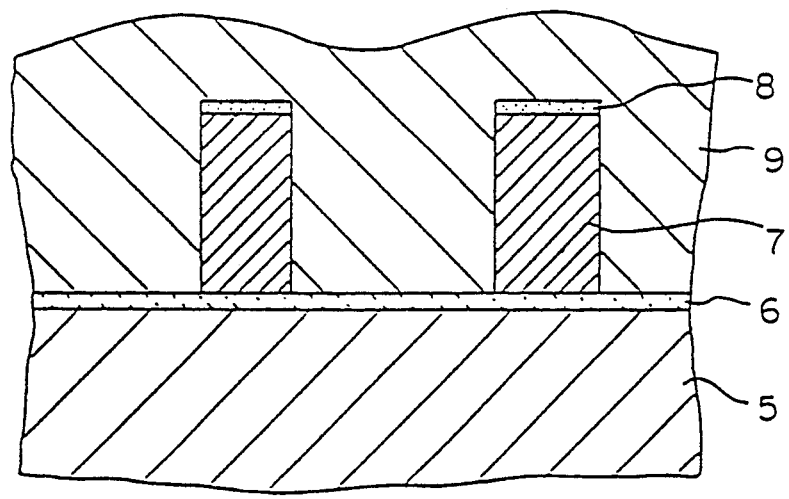
FIG. 10 is a diagram showing the form of a deposit of a thin film of silicon oxide formed at 10 Torr and a low temperature (−30° C.)

When the wafer temperature alone is lowered from room temperature to $-30°$ C., the form is changed to one having a higher degree of flatness, as shown in FIG. 10. The form shown in FIG. 10 is performed under a chamber pressure of 10 Torr. The reason why the flatness is higher than that of the film shown in FIG. 9A is believed to reside in that the cooling of the wafer causes the probability of adsorption of the low-molecular weight polymer on the wafer to be increased.

Then, the flow rate dependency and pulse dependency were examined.

The chamber pressure, RF, RF power, distance between electrodes, pulse frequency, and duty were set to 10 Torr, 13.56 MHz, 300 W, 10 mm, 75 Hz, and 30%, respectively. However, the actual RF power was 300 W×30% due to pulse oscillation. The total flow rate and the $H_2O$ flow rate were maintained at 375 sccm and 300 sccm, respectively, and the TEOS flow rate was varied from 20 sccm to 75 sccm. The total flow rate was kept constant through the use of $N_2$ gas as a balancing gas. The wafer substrate temperature (deposition temperature) was 37° C.

Figure 12:
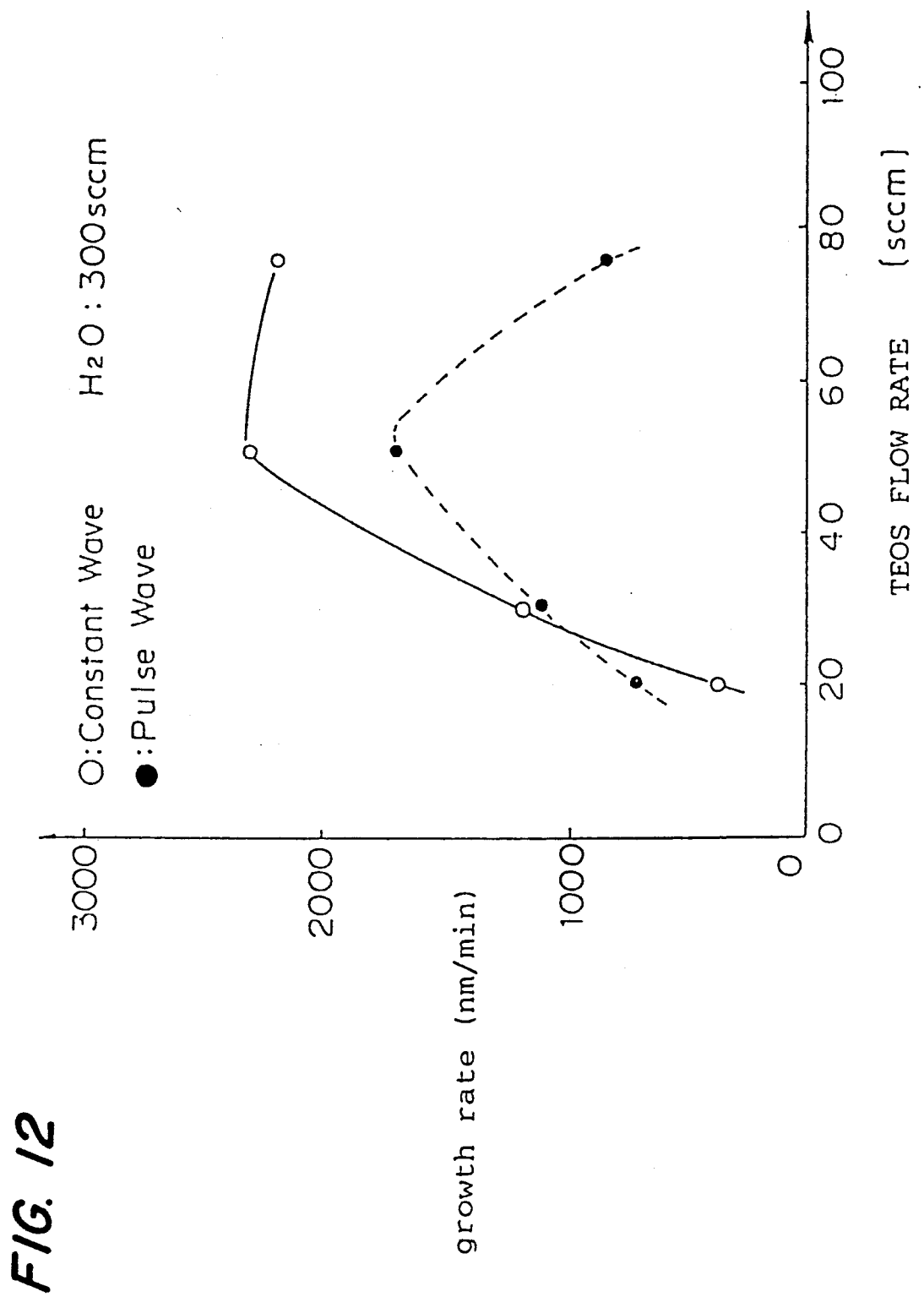
FIG. 12 is a diagram showing a relationship between the TEOS flow rate and the growth rate of a thin film of silicon oxide.

The state of the thin film at that time is summarized in FIG. 11, and the relationship between the TEOS flow rate and the growth rate is shown in FIG. 12.

In FIG. 11, the data on a TEOS/$H_2O$ flow ratio of 1:2 was obtained by measurement under conditions of a TEOS flow rate of 30 sccm, an $H_2O$ flow rate of 60 sccm, and a total flow rate of 550 sccm.

As is apparent from FIG. 11, an increase in the flow rate ratio (TEOS/$H_2O$) causes the thin film to be changed from a solid phase to a liquid phase. Further, as is apparent from FIG. 12, although the growth rate increases when increasing the TEOS flow rate, when the TEOS flow rate is 50 sccm or more, the growth rate falls. At that time, the state of the thin film of silicon oxide on the wafer is changed from a solid state to a liquid state, so that it is estimated that the molecular weight of the polymer formed by a reaction through plasma excitation falls when increasing the TEOS flow rate (increasing the TEOS/$H_2O$ flow rate ratio), or the crosslinking reaction of the polymer is unsatisfactory.

As a result, it is considered that the molecular weight of the polymer adsorbed on the wafer is selected through the correlation among the vapor pressure, chamber pressure (10 Torr), and wafer substrate temperature (37° C.), which gives rise to the formation of a polymer having a low molecular weight unadsorbable on the wafer. This causes the growth rate of a thin film of silicon oxide, formed substantially in a wafer form, to be lowered.

The results of pulsed oscillation of RF power under the same conditions are shown in FIG. 11. The state of the silicon oxide on the wafer is clearly different from that in the case of continuous oscillation.

Thus, RF pulse oscillation enables the molecular weight of the polymer formed by excitation reaction to be efficiently regulated.

Second Example

Figure 13:
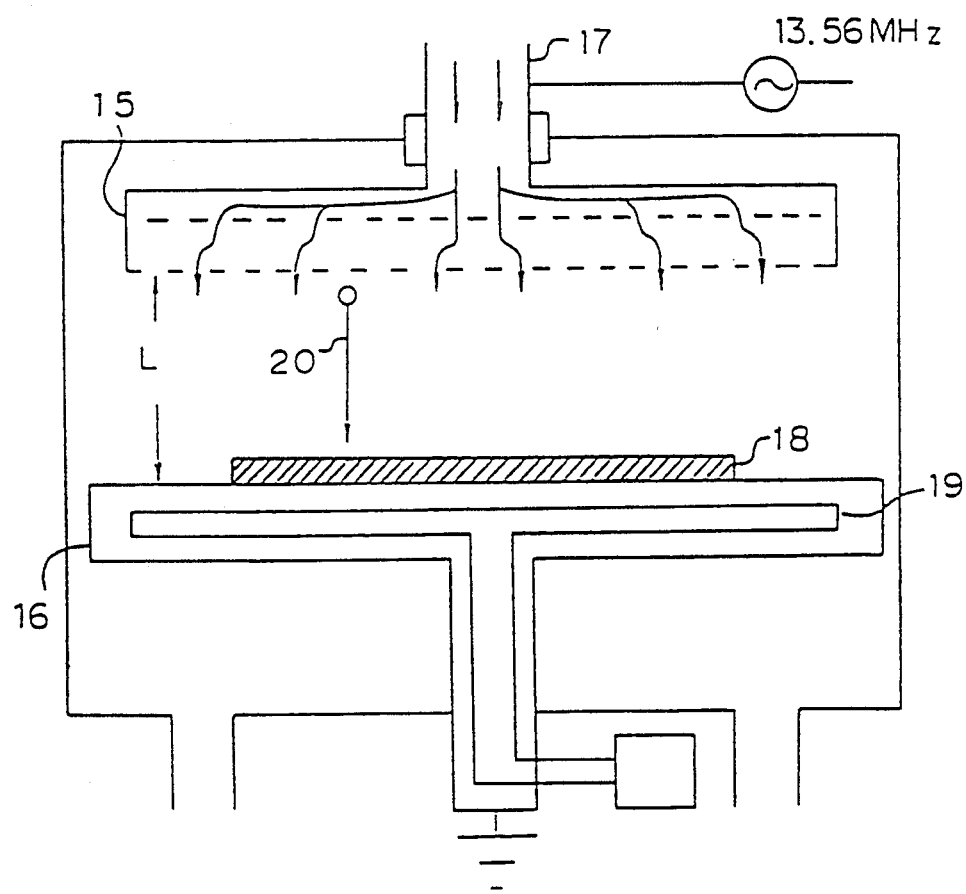
FIG. 13 is a schematic diagram showing a plasma CVD device according to the second example of the present invention.

FIG. 13 is a schematic view of a plasma CVD device according to the second example of the present invention. In FIG. 13, 15 designates an upper electrode, 16 a lower electrode, 17 a gas feed pipe, 18 a wafer (a substrate), and 19 a heater.

The TEOS flow rate, $H_2O$ flow rate, $N_2$ flow rate, RF frequency, and RF power were set to 30 sccm, 120 sccm, 200 sccm, 13.56 MHz, and 300 W, respectively. However, the actual RF power was 60 W (300 W×20%) due to pulse oscillation. Further, the pulse frequency, duty cycle ("on" time), distance between electrodes, L, and pressure in the chamber were set to 100 Hz, 20%, 10 mm, and 10 Torr, respectively.

Figure 14A:
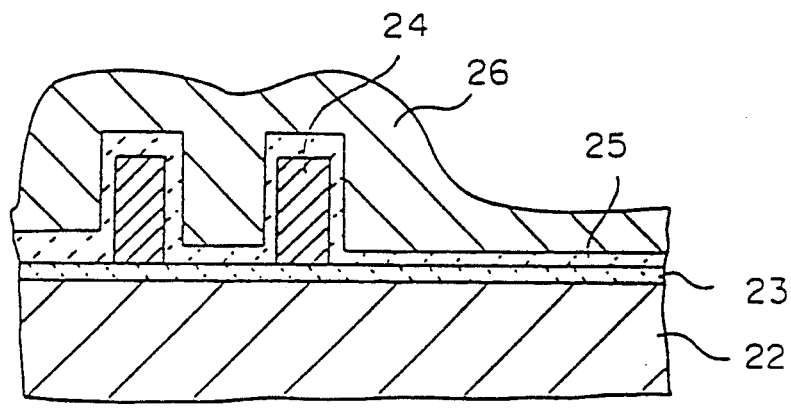
FIGS. 14A and 14B are diagrams showing the form of a deposit of a thin film of silicon oxide deposited through the use of a plasma CVD device according to the second example of the present invention.
Figure 14B:
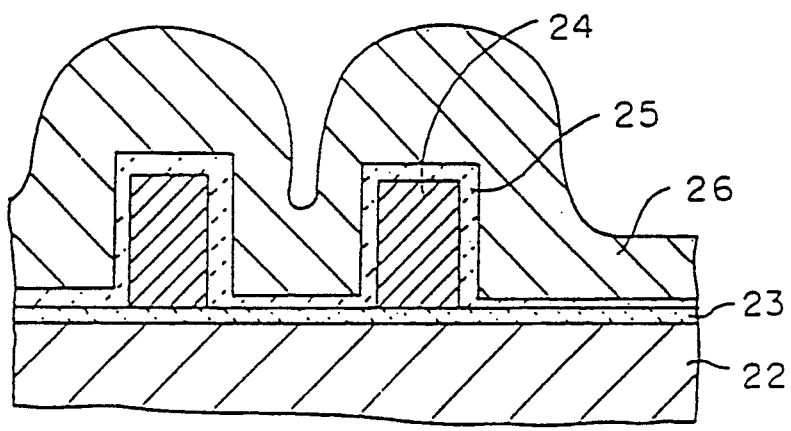

Under these conditions, a 1 μm-thick thin film of an organic-group-containing silicon oxide was deposited with the wafer temperature being varied. The forms of the thin films are shown in FIGS. 14A and 14B (the wafer temperature was 120° C. in the case of FIG. 14A and 150° C. in the case of FIG. 14B). The degree of flatness of the formed films is superior to that of the oxide film formed through the use of TEOS-$O_3$. When the deposition was conducted at 120° C. as shown in FIG. 14A, the organic-group-containing silicon oxide can fill up the grooves, holes, etc. even when the aspect ratio is 10 (i.e., 10:1). In FIGS. 14A and 14B, 22 designates a silicon substrate, 23 a thermally oxidized film, 24 a polycrystalline silicon pattern, 25 a plasma CVD-$SiO_2$ film, and 26 a thin film of silicon oxide containing an organic substance.

In an apparatus shown in FIG. 13, when the area of the gas introduction port (i.e., the hole in the upper electrode 15) of the shower device for introducing a gas into a chamber is about 8 $cm^2$ and the temperature of the gas to be introduced is about 80° C. (since both TEOS and $H_2O$ are liquid, they are gasified), the flow rate of a gas 20 in the ejection port of the shower device becomes 70 cm/sec and the time of access between electrodes becomes 14.3 msec. When the flow rate of $N_2$ as a carrier gas is doubled, that is, increased to 400 sccm, the flow rate and the time of access between electrodes become about 110 cm/sec and about 9 msec, respectively. In this case, since the on time per pulse period of the pulse is 10 msec, the baking time (or curing time) becomes 1 msec. It was confirmed that under these conditions, when there is no excitation by means of RF plasma, no thin film can be formed on the wafer (at least in a period of time practicable from the viewpoint of the process).

Therefore, the deposition of the thin film and the crosslinking reaction (baking or curing) are regulated on the order of msec, which contributes to a significant improvement in the quality of the thin film of (organic-group-containing) silicon oxide. Further, since the excitation is conducted in a pulsed manner, it is possible to realize not only the regulation of the molecular weight of the polymer but also the above-described process effect.

Third Example

A thin film of an organic-group-containing silicon oxide was deposited on a wafer through the use of a plasma CVD device shown in FIG. 13 under the conditions of a pressure in the chamber of 10 Torr, a TEOS flow rate of 30 sccm, an $H_2O$ flow rate of 120 sccm, an $N_2$ flow rate of 400 sccm, an RF frequency of 13.56 MHz, an RF power of 300 W, a pulse frequency of 50 Hz (pulse period:20 msec), a duty cycle of 15% ("on" time:3 msec), and a wafer temperature of 120° C. Then, the resultant thin film of an organic-group-containing silicon oxide was annealed in an atmospheric horizontal oven at 450° C. in an $N_2$ gas atmosphere for 30 min.

Figure 15A:
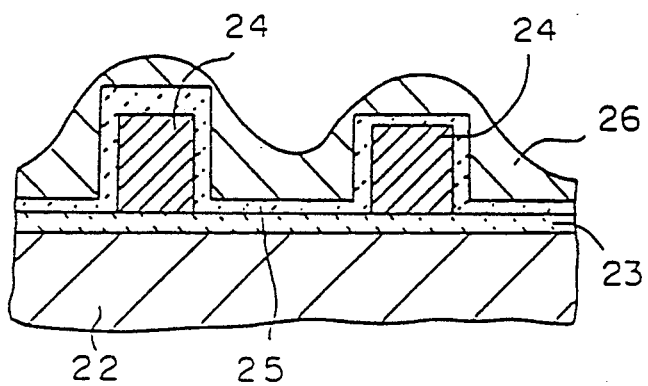
FIGS. 15A and 15B are diagrams for illustrating a thin film of silicon oxide in the case where annealing is conducted in an $N_2$ gas atmosphere after deposition according to the third example of the present invention.

As shown in FIG. 15A, in the thin film of silicon oxide formed under these conditions, not only is it possible to realize planarization, but also the organic component can be removed by the annealing treatment without the occurrence of cracking, so that the resultant thin film has a high reliability.

Figure 15B:
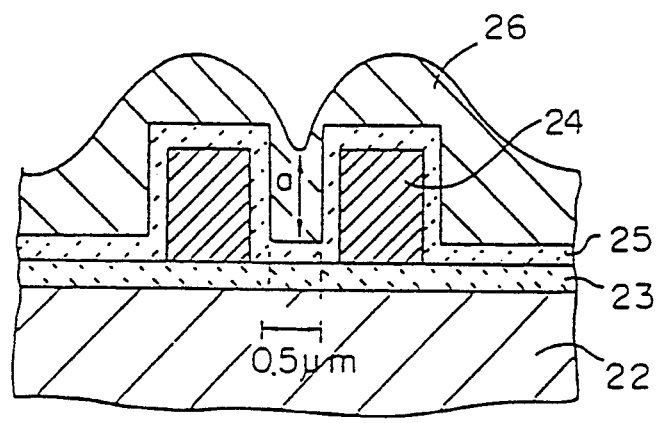

With respect to the occurrence of cracking, in the present example subjected to the annealing treatment, no cracking was observed in a space portion having a width of 0.5 μm shown in FIG. 15B until the film thickness, a, of the reservoir portion reached 0.6 μm. On the other hand, in the conventional inorganic SOG material subjected to the annealing treatment, although the organic component could be removed, when the film thickness, a, of the reservoir portion was 0.6 μm, there occurred cracking which was unfavorable from the practical viewpoint. In FIG. 15B, the polycrystalline silicon 24 had a height of 1 μm, and the plasma CVD-SiO₂ film 25 had a thickness of 300 nm. The removal of the organic component was confirmed by FTIR (Fourier transformation infrared analysis) or the like.

Fourth Example

A thin film of silicon oxide was formed on a wafer through the use of a plasma CVD device shown in FIG. 13 under the conditions of a pressure in the chamber of 10 Torr, a wafer substrate temperature of 120° C., a TEOS flow rate of 30 sccm, an H₂O flow rate of 120 sccm, an N₂ flow rate of 400 sccm, an RF frequency of 13.56 MHz, an RF power of 300 W, a pulse frequency of 100 Hz (10 msec), a duty cycle of 20% ("on" time:2 msec), and an O₂ flow rate of 10 sccm.

The thin film of silicon oxide formed under these conditions was free from opacity and had a good surface homology and a high density. When the O₂ flow rate was increased to 30 sccm, although the thin film became opaque, a particulate SiO₂ power was deposited on the water. From this fact, it was found that O₂ has the effect of catalytically accelerating the reaction.

Thus, a high-density thin film of silicon oxide could be formed through proper control of the O₂ flow rate.

However, when a high-density thin film of silicon oxide was formed with O₂ being added, no filled-up form was obtained in a wiring space at intervals of wiring of 0.5 μm or less and an aspect ration of 1 to 2 and a void (a hole) was formed in the silicon oxide between the wirings.

This suggests that although the addition of O₂ is effective for forming a film having a high density, this means is less effective (or useless) for realizing a planarization comparable to SOG and filling up a wiring space of 0.5 μm or less.

This is also true of H₂ gas. Under the above-described process conditions, the introduction of O₂ gas was stopped, the flow rate of (N₂+H₂) gas was maintained at a constant value of 400 sccm, and the H₂ flow rate was varied to 0 sccm (N₂ flow rate:400 sccm), 50 sccm (N₂ flow rate:350 sccm), 100 sccm (N₂ flow rate:300 sccm), 150 sccm (N₂ flow rate:250 sccm), and 200 sccm (N₂ flow rate:200 sccm). The other process conditions were the same as those used above. Further, the relationship between the H₂ gas flow rate and the filling-up property of the silicon oxide film was examined in a line & space pattern having a step (height) of wiring of 1 μm and a wiring width of 1 μm with the wiring intervals being variously, 1.0 μm, 0.75 μm, 0.5 μm and 0.2 μm.

The results are given in the following table. In the table, O represents that filling-up was conducted without occurrence of a void (a hole), and X represents that a void (a hole) occurred.

| H₂ flow rate | Intervals of wiring | | | |
|---|---|---|---|---|
| | 1.0 μm | 0.75 μm | 0.5 μm | 0.2 μm |
| 0 sccm | o | o | o | o |
| 50 sccm | o | X | X | X |
| 100 sccm | X | X | X | X |

No data on the H₂ flow rates of 150 sccm and 200 sccm were given in the table because the thin film became in the opaque state due to the deposition of particulate SiO₂ powder on the wafer. It is estimated that the addition of H₂ enables a high-density film to be formed. However, as is apparent from the above table, it is recognized that, as with the addition of O₂, the addition of H₂ is ineffective for realizing the formation of a planar thin film. In the case of the addition of H₂ to H₂O, the amount of addition of H₂ is 20% by volume at the largest, still preferably 10% by volume or less, based on the total amount of H₂O and H₂.

Figure 16A:
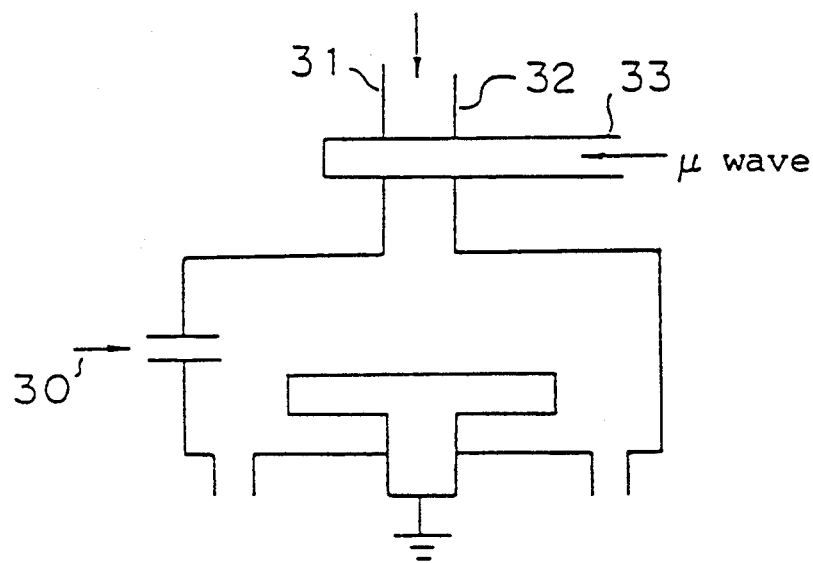
FIGS. 16A and 16B are schematic diagrams of a CVD device in the case where use is made of microwave excitation applicable to the present invention.
Figure 16B:
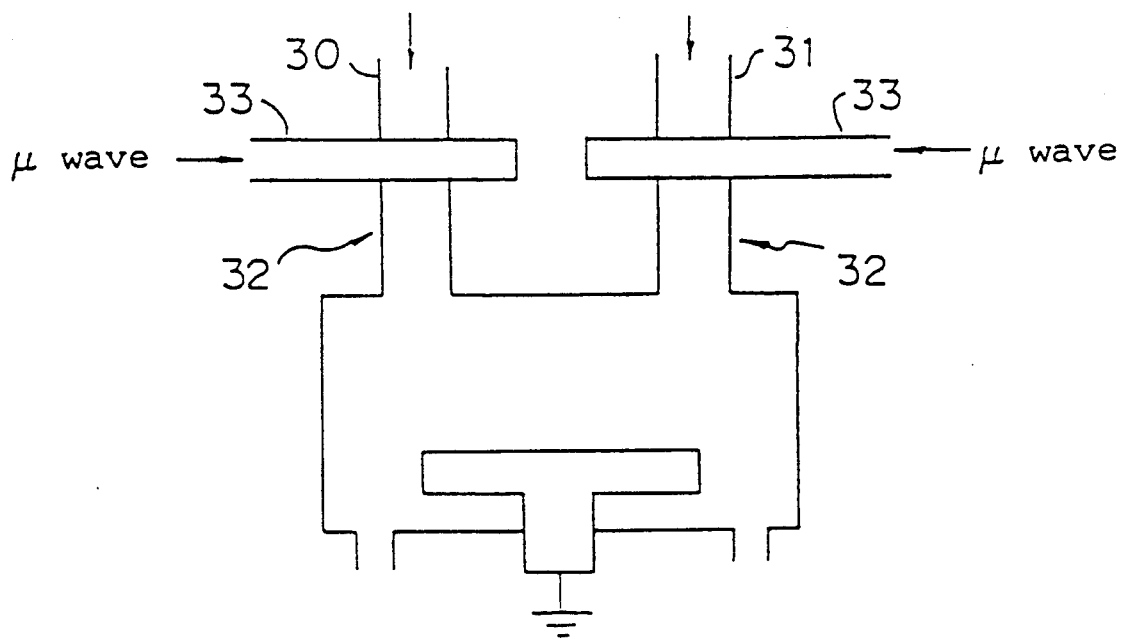

Further, in the present invention, the formation of a thin film may be conducted through the use of CVD devices as shown in FIGS. 16A and 16B wherein use is made of excitation by a down flow system through the use of a μ-wave power or an RF power. In this case, the source gases can be excited separately from each other, which contributes to a further improvement in the controllability of the process. In these drawings, 30 designates an organosilane introduction port, 31 an introduction port for H₂O, N₂, or the like, 32 a quartz tube, and 33 a μ-wave tube.

Fifth Example

Use is made of a planar-type (anode couple) plasma CVD system shown in FIG. 13. A high-frequency (RF) discharge between electrodes is used for the excitation of a gas. In this case, the RF frequency is 13.56 MHz. Both TEOS and H₂O are introduced in the form of vapor by heating a source tank, piping, etc. N₂ is used as a carrier gas. An electrode on the upper cathode side serves also as a port for introduction of these gases into the chamber and is in the form of a shower device. On the other hand, a heating wire for control of the temperature is provided within an electrode on the lower anode side so that the temperature of the wafer can be controlled.

A film is formed under conditions of a TEOS flow rate of 30 sccm, and a H₂O flow rate of 120 sccm (flow ratio of 1:4) while simultaneously passing N₂ as a carrier gas at a flow rate cf 400 sccm. Excitation is conducted by pulse oscillation under an RF frequency of 13.56 MHz and an RF power of 300 W. In this case, pulse conditions are set to a period of 10 msec, a duty cycle of 20% ("on" time:2 msec), a distance between electrodes of 10 mm, a pressure within the reaction chamber of 10 Torr, and a wafer temperature of 120° C.

In the plasma treatment, excitation is conducted by continuous oscillation under conditions of an O₂ flow rate of 80 sccm, an N₂ flow rate of 400 sccm, an RF frequency of 13.56 MHz, and an RF power of 300 W. In this case, the distance between electrodes, the pressure within the reaction chamber, and the wafer temperature were 10 mm, 1.5 Torr, and 120° C., respectively.

Under the above-described conditions, the formation of a film and the plasma treatment were alternatively repeated within an identical (i.e., the same) chamber.

Figure 17A:
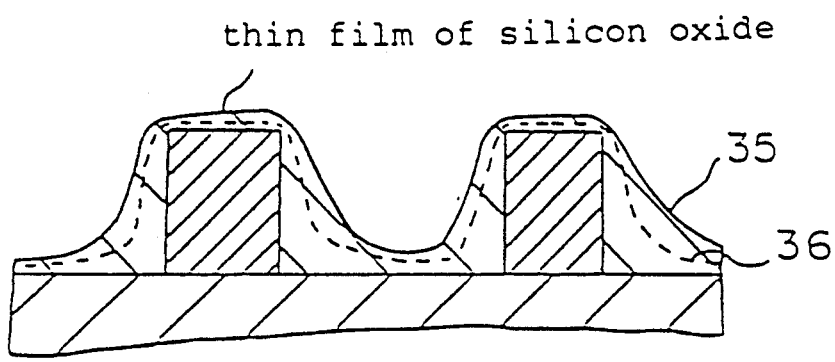
FIGS. 17A and 17B are diagrams for illustrating a thin film of silicon oxide formed by repeating the formation of a film step and a plasma treatment step according to the fifth example of the present invention.

Specifically, a thin film 35 of an organic-group-containing silicon oxide having a thickness of about 100 nm was formed on the wafer under the above-described film forming conditions, and the wafer was exposed to a plasma for 30 sec under the above-described plasma conditions. As a result, no cracking occurred, the organic component contained in the thin film 35 was removed (this was confirmed by FTIR), and the film thickness was reduced as indicated by a broken line (see FIG. 17A).

Figure 17B:
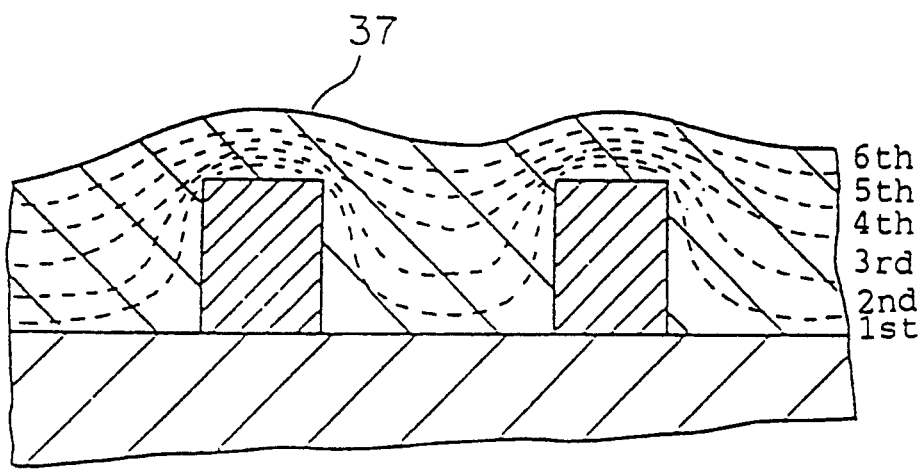

Thus, the repetition of the steps of the formation of a thin film and the subsequent plasma treatment (repetition of six times in FIG. 17B) enables a planar thin film 37 of an inorganic silicon oxide having a large thickness (1000 nm or more) to be formed (see FIG. 17B).

Sixth Example

The dependency of the quality of the film upon the substrate temperature and the oscillation conditions was examined through the use of a CVD device shown in FIG. 13 under conditions of a TEOS flow rate of 30 sccm, an $H_2O$ flow rate of 120 sccm, an $N_2$ flow rate of 400 sccm, a pressure of 10 Torr, an RF frequency of 13.56 MHz, an RF power of 300 W, and a distance between electrodes of 10 mm.

Figure 18A:
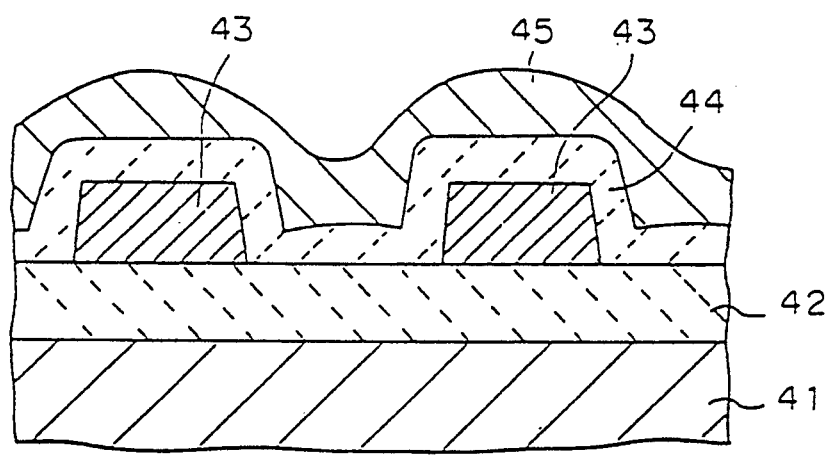
FIGS. 18A, 18B, 18C, 18D, 18E and 18F are microphotographs of a thin film of silicon oxide formed by a method according to the sixth example of the present invention and a model diagram of the thin film.

As shown in FIG. 18A, a BPSG film (film thickness:600 nm) 42 was formed on a silicon substrate 41, an aluminum wiring pattern (height:500 nm) 43 was formed thereon, an $SiO_2$ film (film thickness:300 nm) 44 was thinly formed over the whole surface by a CVD process, and an organic-group-containing silicon oxide film 45 was deposited on the $SiO_2$ film as a base by a TEOS-$H_2O$ plasma CVD process.

Figure 18B:
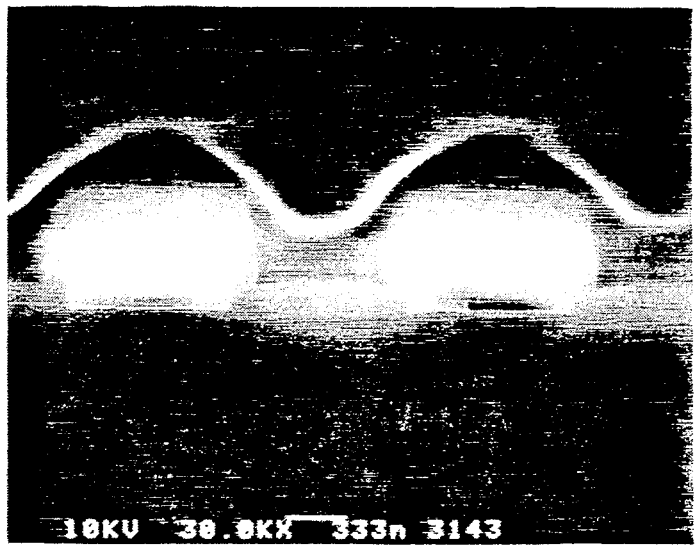
Figure 18C:
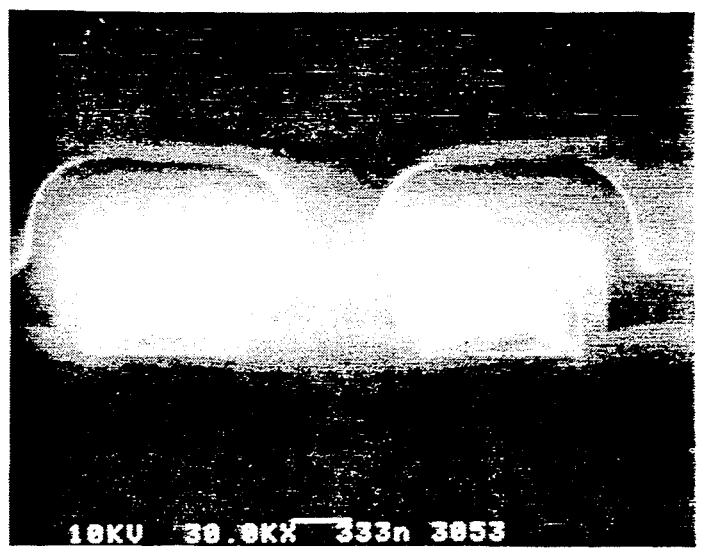
Figure 18D:
Figure 18E:
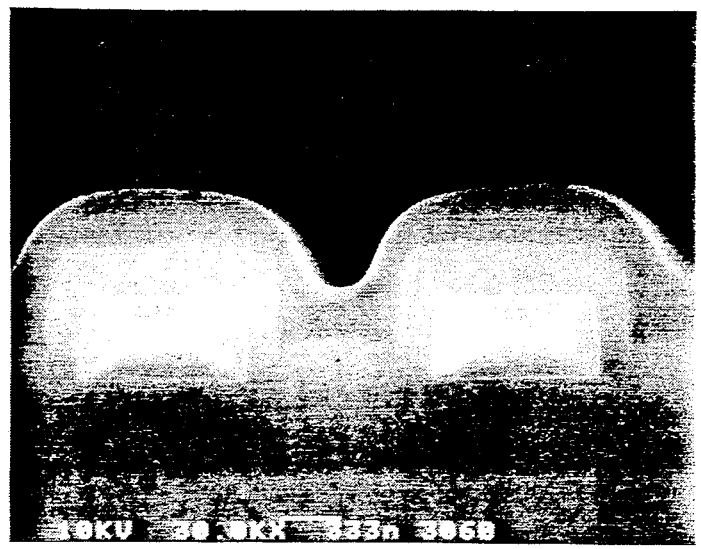
Figure 18F:
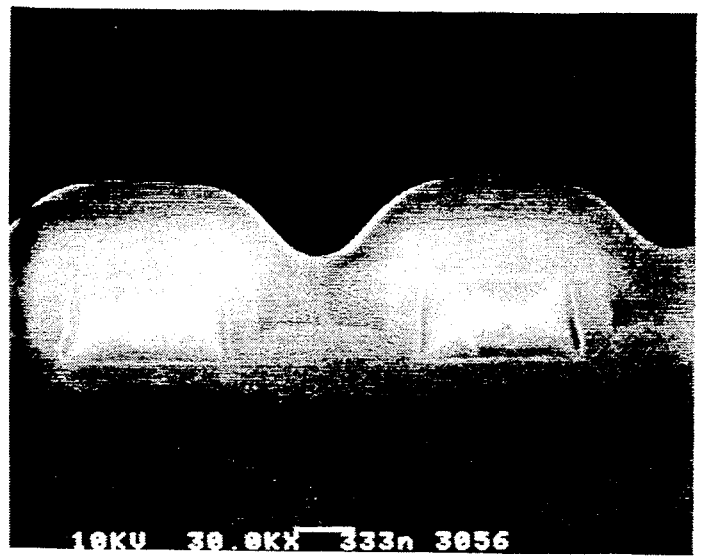

The results are shown in FIGS. 18B to 18F. As shown in FIG. 18B, a sufficiently flat film is formed at a substrate temperature of 65° C. by continuous oscillation. However, when the substrate temperature is raised to 150° C., as shown in FIG. 18C, although a continuous film is formed by continuous oscillation, the degree of flatness of the film is reduced to a considerable extent. When the substrate temperature is kept constant at 150° C. and pulse oscillation is conducted at a pulse frequency of 100 Hz (pulse period:10 ms) with the duty cycle ("on" time) being lowered to 50%, 40%, and 30%, as shown in FIGS. 18D, 18E, and 18F, the flatness increases with reduced duty cycles. Thus, in the present invention, it was demonstrated that a planar film could be deposited at a higher temperature through a lowering of the duty cycle of the pulse oscillation.

Figure 19:
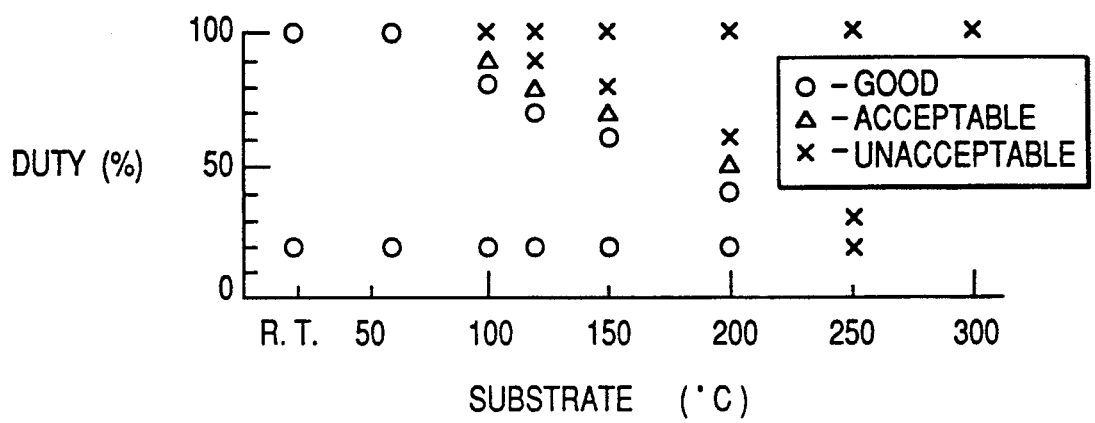
FIG. 19 is a diagram showing the relationship between the substrate temperature and the pulse excitation duty cycle and the resultant effective planarizing of a film formed by a method according to the sixth example of the present invention.

FIG. 19 is a graph showing, as a function of the substrate temperature and duty, whether or not a good planarized film which is satisfactory from the viewpoint of practicability can be formed under the same condition as that described above. The practicability was judged, based on whether or not a pattern having wiring intervals of 0.5 μm and an aspect ratio of about 1 to 2 can be filled up.

Figure 20:
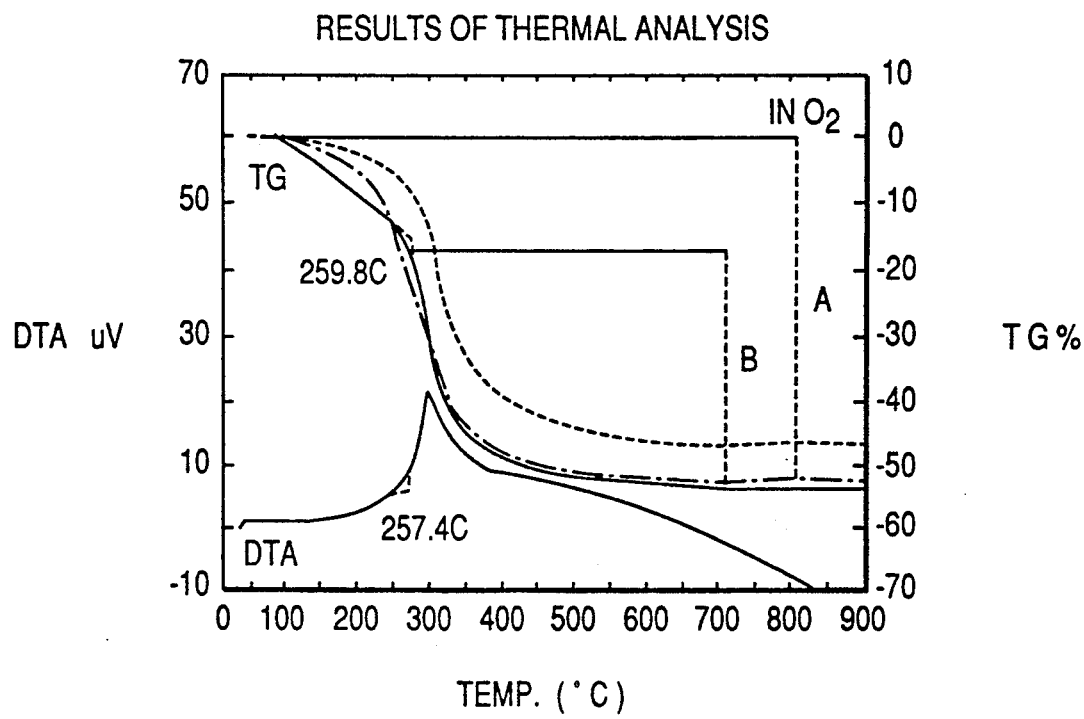
FIG. 20 is a diagram showing the results of thermal analysis of a film formed according to the sixth example of the present invention.

FIG. 20 shows the results of a thermal analysis of the deposited film, immediately after deposition thereof. The results of the measurement of weight loss on heating (TG) and the differential thermal analysis (DTA) are given. Specifically, a solid line represents the test results of a film formed by continuous oscillation at a substrate temperature of 60° C., a broken line represents the test results of a film formed by continuous oscillation at a substrate temperature of 150° C., and a chain line represents the test results of a film formed by pulse oscillation (pulse frequency:100 Hz) under a substrate temperature of 150° C. and a duty cycle of 30%. In all cases, since the oxidation reaction is initiated at about 250° C., most of the organic components in the film are estimated to be ethoxy groups.

In FIG. 20, the results of DTA are shown for a film formed by continuous oscillation at 60° C.

FIG. 21 shows a molecular weight distribution of a film formed under a pulse duty cycle of 30% (pulse frequency:100 Hz) together with a molecular weight distribution of a film formed by an organic SOG process. In the drawing, the solid line represents the molecular weight distribution of a film formed by the organic SOG process, the broken line represents the molecular weight distribution of a film formed according to the process of the present invention, Mw represents a weight average molecular weight, and Mn represents a number average molecular weight.

Seventh Example

Figure 22A:
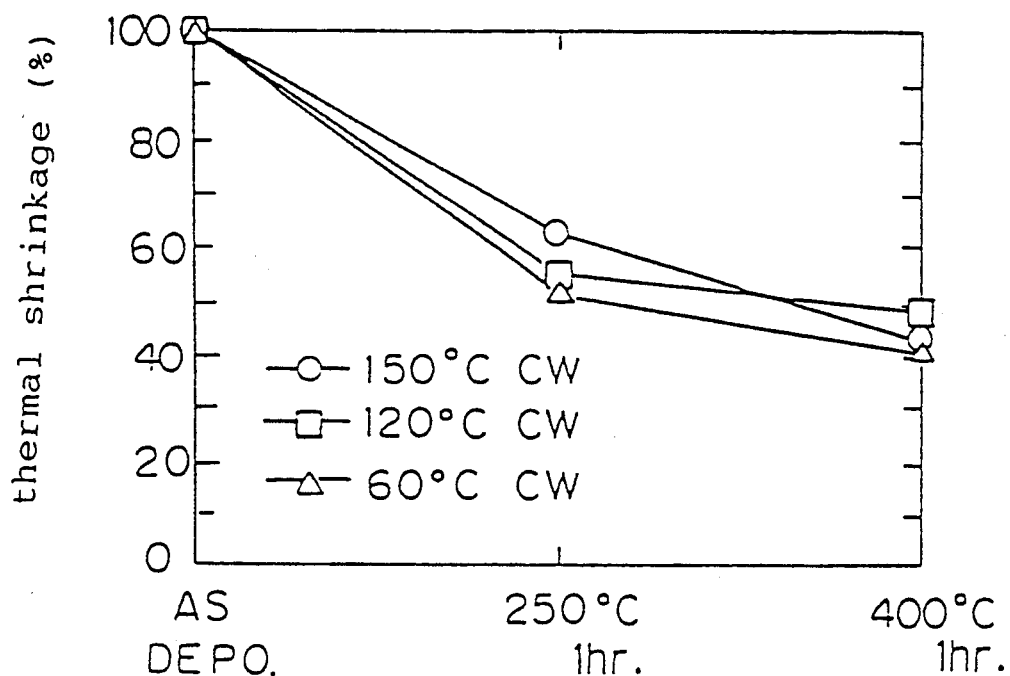
FIGS. 22A and 22B are diagrams showing the percent thermal shrinkage and the etching rate of a film formed without a plasma treatment.
Figure 22B:
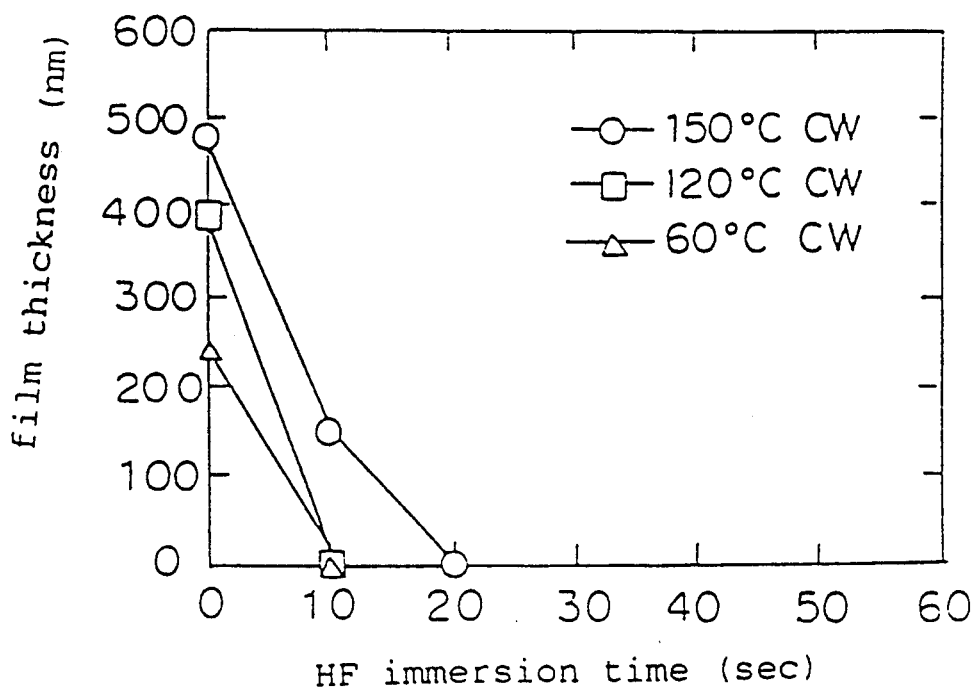

The heat shrinkage and etching rate of films formed as described in the sixth example are shown in FIGS. 22A and 22B. The films were respectively formed by continuous oscillation at 60° C., 120° C., and 150° C. The heat shrinkage of the films was measured by heat-treating the films at 250° C. and 400° C. in an $N_2$ atmosphere through the use of an atmospheric pressure horizontal oven in an $N_2$ atmosphere for one hour. On the other hand, the etching rate was measured by heat-treating the films in an atmospheric pressure horizontal oven in an $N_2$ atmosphere at 250° C. for one hour and at 400° C. for one hour and then immersing the heat-treated films in 0.5% HF.

The heat shrinkage and etching rate were larger than those of the inorganic SOG film and were 50% and 1500 nm/min or more, respectively. For example, the heat shrinkage and etching rate of an inorganic SOG film heat-treated in an $N_2$ atmosphere at 450° C. for 30 min were 23.1% and 120 nm/min, respectively.

The use of $H_2O$ plasma was attempted as a means for improving the etching rate. Specifically, as shown in FIG. 23A, in the experiment, a film formed under conditions of a TEOS flow rate of 30 sccm, an $H_2O$ flow rate of 120 sccm, an $N_2$ flow rate of 400 sccm, a continuous oscillation at 13.56 MHz and 300 W, a pressure of 10 Torr, and a temperature of 60° C. was baked on a hot plate (at 150° C. in an $N_2$ atmosphere) for 2 minutes, an $H_2O$ plasma treatment was conducted within the same chamber as that used in the formation of the film, and annealing under reduced pressure (1 Torr, partial pressure of $H_2O$:100%) was then conducted at 250° C. and 400° C. each for 2 minutes. $H_2O$ plasma treatment was conducted under conditions of a temperature of 150° C., a pressure of 1 Torr, an $H_2O$ partial pressure of 100%, a frequency of 13.56 MHz, and a power of 100 W with the treatment time being varied. The etching rate of a film subjected to the $H_2O$ plasma treatment is shown in FIG. 23B. From the results, it is apparent that, as compared with a control film not subjected to the $H_2O$ plasma treatment, all the films subjected to the $H_2O$ plasma treatment under various conditions exhibit a lower etching rate and a better modification effect in a region of 50 to 70 nm on the surface of the film.

Figure 24:
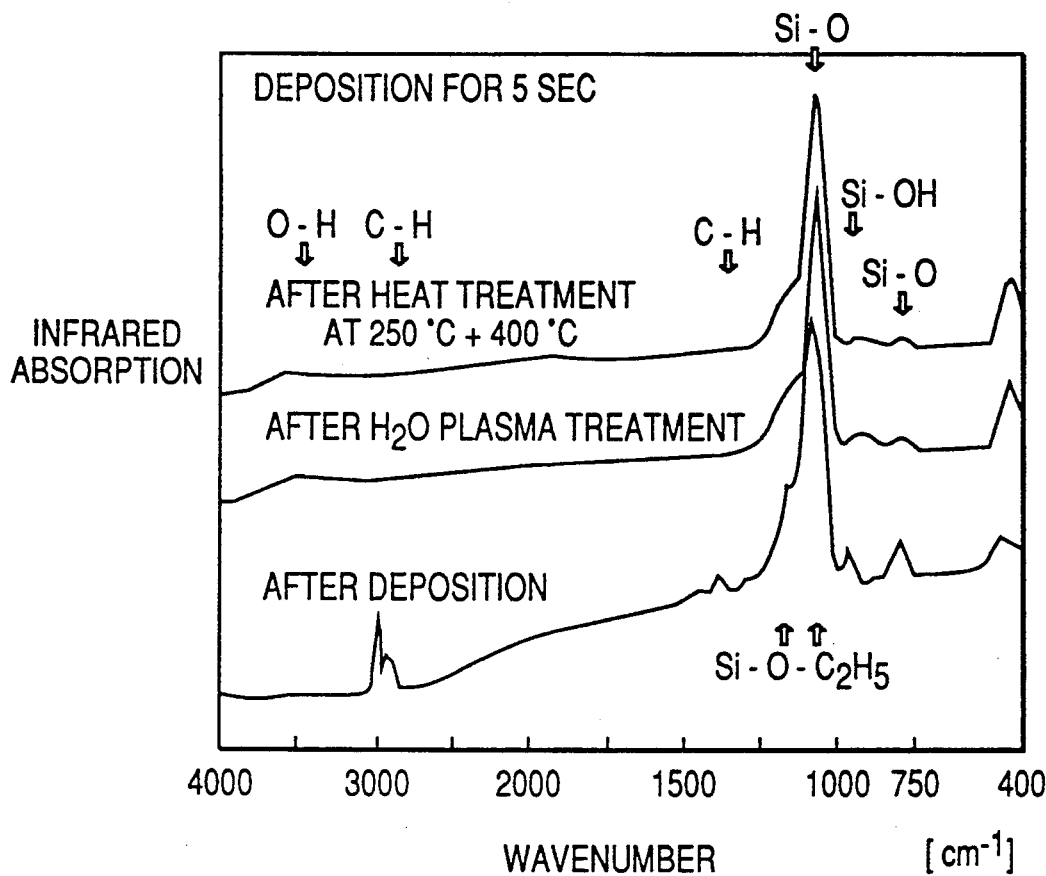
FIG. 24 is a diagram showing data of infrared absorption of a film after deposition after an $H_2O$ plasma treatment and after a heat treatment.

FIG. 24 is an infrared absorption spectrum of a film formed by conducting a deposition for 5 seconds through pulse oscillation under conditions of a temperature of 150° C., a pressure of 10 Torr, a TEOS flow rate of 30 sccm, an $H_2O$ flow rate of 120 sccm, an $N_2$ flow rate of 400 sccm, a frequency of 13.56 MHz, a power of 300 W, a pulse frequency of 100 Hz, and a duty cycle of 30% ("on" time:3 ms), subjecting the deposited film to the above-described H$_2$O plasma treatment for one minute and heat-treating the film at 250° C. and 400° C. It is recognized that the organic component in the film is reduced by the H$_2$O plasma treatment to substantially zero. That is, this shows that the H$_2$O plasma treatment is useful for removing the organic groups in the film and, in particular, when the deposition time is short, the modification effect is large because the unit film thickness subjected to the plasma treatment is small.

Figure 25:
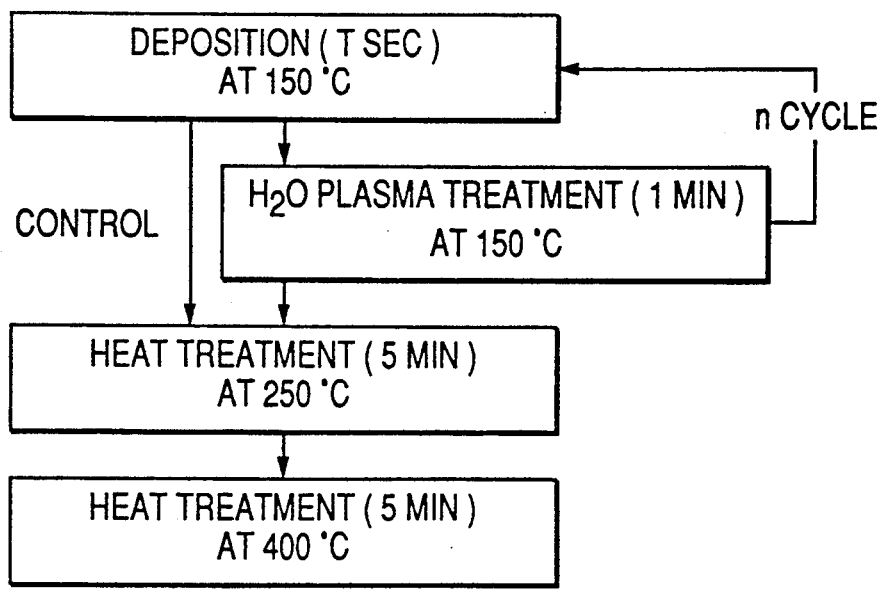
FIG. 25 is a flow diagram showing a process wherein a thin film of silicon oxide is formed by repeating a deposition step and an $H_2O$ plasma treatment step according to the seventh example of the present invention.

Then, an attempt was made to repeat a unit process wherein a film is thinly deposited and subjected to an H$_2$O plasma treatment (repeat process). The sequence of the repeat process is shown in FIG. 25. A film deposited under conditions of a temperature of 150° C., a pressure of 10 Torr, a frequency of 13.56 MHz, a power of 300 W, a pulse frequency of 100 Hz, and a duty cycle of 30% was subjected to an H$_2$O plasma treatment under conditions of a temperature of 150° C., a pressure of 1 Torr, an H$_2$O partial pressure of 100%, a frequency of 13.56 MHz, and a power level of 100 W. The unit deposition time was varied in the range of from 5 to 30 sec. A plasma treatment was conducted for one minute each time the deposition was performed, and the formation of a film was conducted so that the total deposition time was 3 minutes. Thereafter, annealing under reduced pressure (1 Torr, H$_2$O partial pressure:100%) was conducted at 250° C. and 400° C. each for 5 minutes. The etching rate and shrinkage of films formed under the above conditions are given in the following table. For comparison, data in the case where an inorganic SOG film was annealed at 450° C. in an N$_2$ atmosphere for 30 minutes was also given in the table.

| Film conditions | Unit deposition time (sec) | Unit deposition film thickness (nm) | Etching rate (nm/min) | Shrinkage (%) |
|---|---|---|---|---|
| Inorganic SOG | | | 120 | 23.1 |
| Repeat Process | 5 | 23.3 | 140 | 4.2 |
| | 10 | 46.7 | 170 | 12.9 |
| | 15 | 70 | 210 | 25.3 |
| | 30 | 140 | 550 | 17.9 |
| No plasma treatment, heat treatment alone (control) | | | 1300 or more | 51.4 |

In the repeat process, the shorter the unit deposition time, the lower the etching rate and the better the film quality. In the film formed in a unit deposition time of 5 seconds, the etching rate is on the same level as that of the inorganic SOG level, and the etching rate is substantially equal or uniform, from the surface of the film to the inside of the film. The shrinkage of the film formed in a unit deposition time of 5 seconds is 4.2% after annealing at 400° C., that is, 1/5 or less that of the inorganic SOG (annealed at 450° C. for 30 min).

Figure 26:
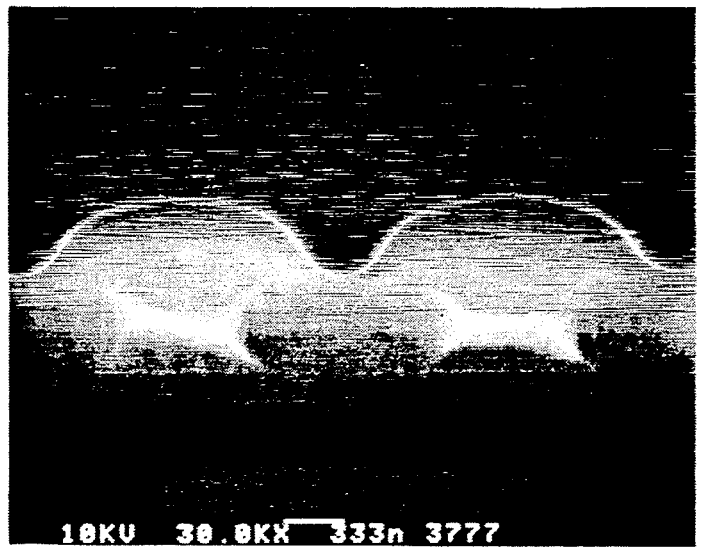
FIG. 26 is a micrograph of a silicon oxide film formed by a duplication process shown in FIG. 25.

FIG. 26 is a photograph of a section of a film formed by the repeat process where the deposition and the plasma treatment are repeated. The film forming conditions are the same as those used for the formation of a film in a unit deposition time of 5 seconds. As shown in FIG. 24, this film is converted to an inorganic state, and the etching rate as well is on the same level as that of the inorganic SOG film. This demonstrates that the flattening of the film has been realized.

In the present example, although the H$_2$O plasma treatment was conducted under conditions of a temperature of 150° C., a pressure of 1 Torr, an H$_2$O partial pressure of 100%, a frequency of 13.56 MHz, and a power of 100 W, the treatment pressure can be properly selected in the range of 0.1 Torr to 15 Torr. In particular, with the consideration of the throughput (treatment time) in the process, when use is made of the repeat process wherein the deposition and the plasma treatment are continuously conducted within an identical chamber, it is preferred that the pressure used in the H$_2$O plasma treatment be the same as the deposition pressure. In this case, the H$_2$O plasma treatment pressure in the present example is 10 Torr. It is apparent that the same effect can be obtained at 10 Torr.

In the H$_2$O plasma treatment, although the partial pressure of H$_2$O was 100%, it is naturally considered that N$_2$ or an inert gas, such as He or Ar, can be properly mixed as a carrier gas. In particular, when N$_2$ and H$_2$O gas are simultaneously used, it is generally considered that the plasma treatment causes a thin layer containing N to be formed on the surface of the thin film of an organic-group-containing silicon oxide, and it is estimated that the whole film can comprise a silicon oxide nitride film (SiON) through the repetition of the deposition and the plasma treatment as in the repeat process. The formation of the SiON film enables the film to have a water resistance superior to that of the silicon oxide film free from N.

In the H$_2$O plasma treatment, although the RF frequency (high frequency) was 13.56 MHz, it is also, possible to use other frequency regions, or ranges to the extend that an H$_2$O plasma can be generated.

In the present example, use was made of plasma conditions of a frequency of 13.56 MHz and a power of 100 W. Under repeat process conditions of the present example, an H$_2$O plasma treatment under conditions of a frequency of 13.56 MHz and a power of 100 W and an H$_2$O plasma treatment under conditions of a frequency of 13.5 MHz and a power of 300 W were compared with each other in a unit deposition time of 15 seconds with all the other conditions being the same. The etching rate and the film shrinkage of the film subjected to the H$_2$O plasma treatment under conditions of a frequency of 13.56 MHz and a power of 100 W were as given in the above table. On the other hand, the film subjected to the H$_2$O plasma treatment under conditions of a frequency of 13.56 MHz and a power of 300 W gave rise to cracking during annealing at 250° C. and 400° C. The reason for this is believed to reside in that when the H$_2$O plasma treatment is conducted through the use of a large RF power (a large excitation energy), since the surface of the film, alone, is rapidly modified, a dense silicon oxide film is formed on the surface of the film before the organic group within the film is decomposed and removed by the H$_2$O plasma treatment Therefore, in this case, it is necessary to shorten the unit deposition time, that is, to reduce the unit deposition film thickness.

The repeat process was conducted in the same manner as that of the present example, except that the H$_2$O plasma treatment conditions were changed to a temperature of 150° C., a pressure of 10 Torr, an H$_2$O partial pressure of 100%, a frequency of 13.56 MHz, and a power of 300 W, and the unit deposition time was 10 seconds. As a result, the etching rate and the film shrinkage were substantially the same as those in the case of a unit deposition time of 10 seconds in the above table. This shows that the same effect can be sufficiently attained also under other conditions by properly setting the treatment pressure, RF power, etc.

Eighth Example

Figure 27:
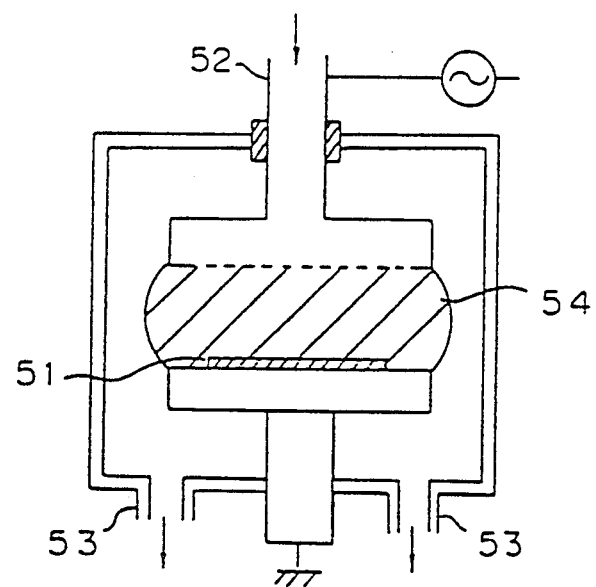
FIG. 27 is a schematic diagram showing a film forming device wherein use is made of a planar-type (diode parallel plates) RF discharge applicable to the present invention.
Figure 28:
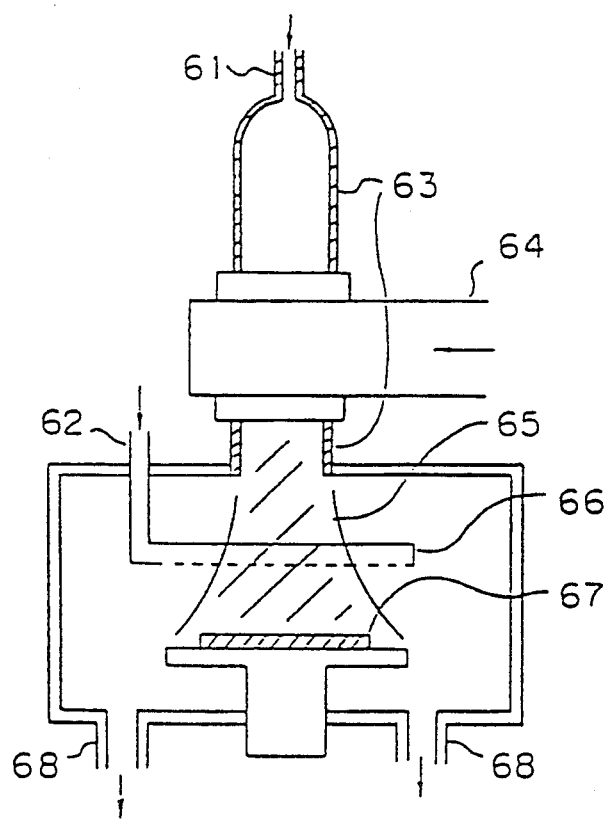
FIG. 28 is a schematic diagram showing a film forming device wherein use is made of $\mu$-wave downflow plasma applicable to the present invention.

In the present invention, use may be made of a film forming device utilizing a planar-type RF discharge as shown in FIG. 27. In the drawing, 51 designates a wafer, 52 a gas introduction port, 53 an exhaust port, and 54 a plasma region. Further, use may be made of a film forming device as shown in FIG. 28 wherein a μ-wave downflow plasma is utilized. In FIG. 28, 61 designates a gas introduction portion ($H_2O$, $N_2$, etc.), 62 a gas introduction port (TEOS, $N_2$, etc.), 63 a quartz portion, 64 a μ-waveguide, 65 a plasma region, 66 a ringed quartz shower device, 67 a wafer, and 68 an exhaust port. It is a matter of course that a film is formed in a portion exposed to plasma based on the same concept as that on the wafer. Further, a film is formed also in a portion not exposed to plasma, depending upon the flow of the gas.

Therefore, in order to suppress the adsorption of a polymer formed by the excitation reaction, it is very effective also to heat portions, other than the wafer, to at least room temperature. In particular, in the case of a planar-type CVD device such as the film forming device shown in FIG. 27, the temperature of the counter electrode on which a wafer is placed (the electrode on which a wafer is placed is of course regulated for controlling the wafer temperature) is very important for keeping the growth rate of a film on the wafer constant. When the counter electrode is provided on the side of application of a high-frequency power, as in a film forming device shown in FIG. 28, since it is difficult to directly conduct heating and control by means of a heater, heating and control through a medium are considered effective.

Figure 29:
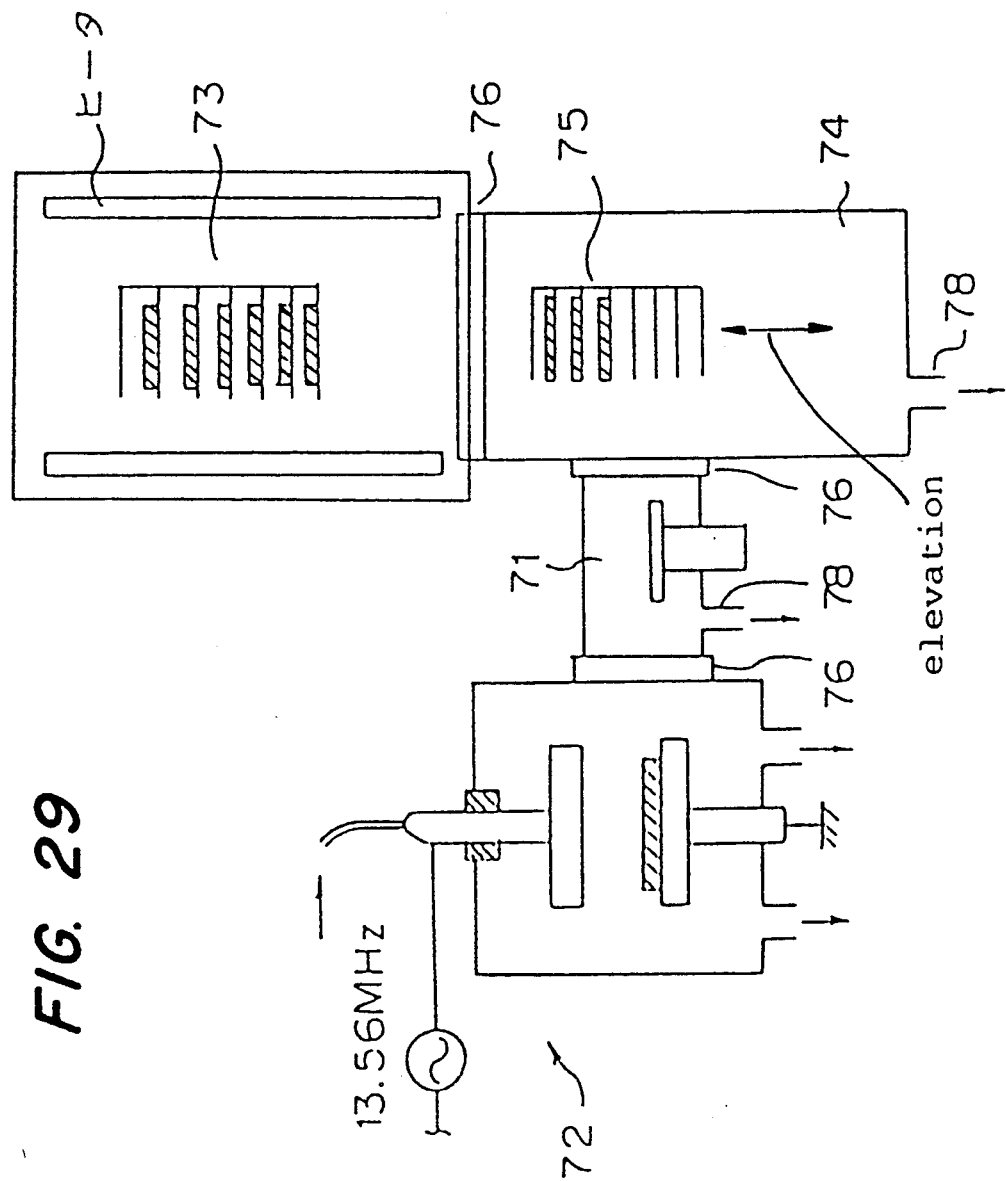
FIG. 29 is a schematic diagram showing a film forming (single wafer treatment) device and an annealing (batch treatment) device applicable to the present invention.

Further, in the present invention, as shown in FIG. 29, use may be made of a film forming (single wafer treatment) device 72 and an annealing treatment (batch treatment) device 73 through a load-lock chamber 71, and it is possible to store the wafer having the thin film of silicon oxide formed thereon in a chamber having a controlled atmosphere, pressure, and temperature in an identical (i.e., the same) apparatus and to conduct an annealing treatment within a chamber having a controlled atmosphere, pressure, and temperature in an identical (i.e., the same) apparatus when the number of stored wafers has reached a predetermined value, or level. In FIG. 29, 74 designates a wafer storage portion, 75 a wafer support portion (carrier), 76 a gate, and 77 an exhaust port.

Figure 30A:
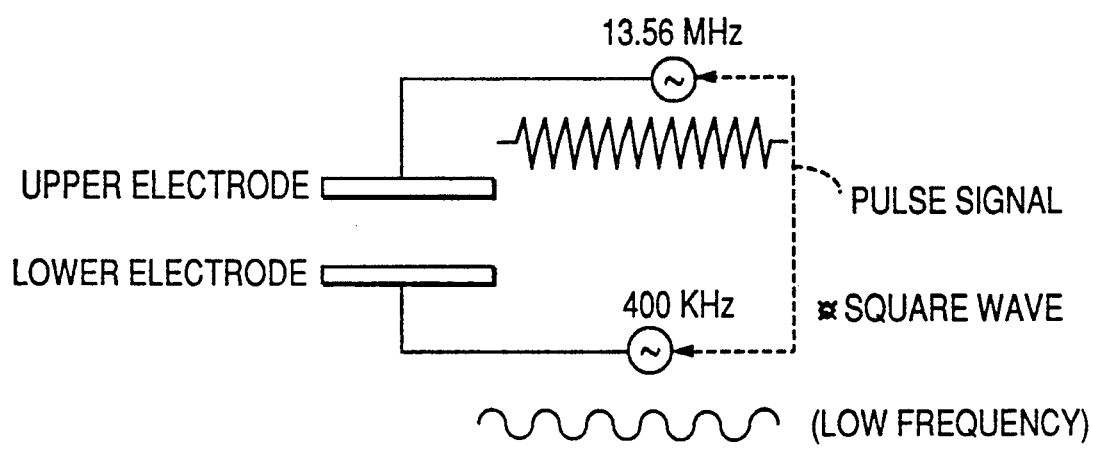
FIGS. 30A and 30B are diagrams illustrating a method of applying a high frequency power and a low frequency power in a process for the formation of a film applicable to the present invention.
Figure 30B:
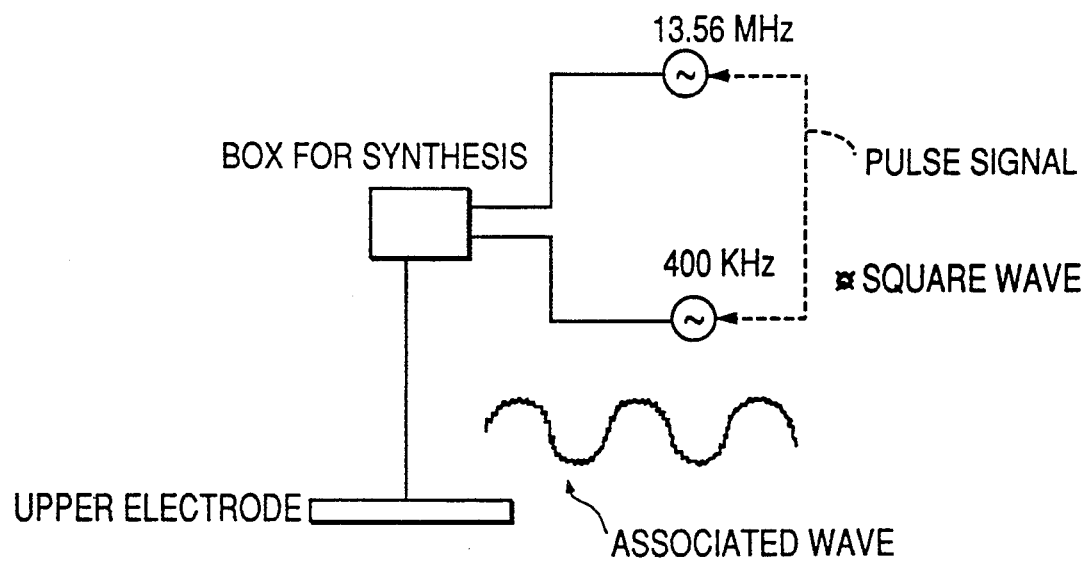

Further, in the present invention, a high-frequency power and a low-frequency power may be applied to the electrode in a simultaneous, continuous or pulsing manner through the use of a planar-type CVD device capable of realizing the above-described film forming process. In this case, an RF power source of 13.56 MHz and a low-frequency power source of 1 MHz or less may be used as the high-frequency power and the low-frequency power, respectively. Specific examples of the method of applying the high-frequency power and the low-frequency power to the electrode include a method as shown in FIG. 30B wherein the high-frequency power and the low-frequency power are simultaneously applied to an identical electrode and a method shown in FIG. 30A wherein the high-frequency power and the low-frequency power are separately and simultaneously applied to respective, spaced electrodes facing each other. An example of a box for synthesis shown in FIG. 28B is shown in FIG. 29.

According to the present invention, an insulating film having a flatness or planarization comparable to that of a silica glass formed by an SOG process, an excellent plasma resistance, and a high reliability can be formed in a desired film thickness, which renders the insulating film useful as an interlayer insulation film of a semiconductor device, etc.

We claim:

1. A process for the formation of a silicon oxide film, comprising the steps of:

exciting a gas, comprising an organosilane or organosiloxane gas constituent and a gas constituent containing H and OH, above a substrate in a reaction chamber thereby to cause the gas constituents to react with each other in a gaseous phase or on the substrate and thereby to deposit a thin film of an organic-group-containing silanol, silanol polymer, or siloxane-bonded polymer on the substrate; and removing the organic groups from the thin film to obtain a silicon oxide film.

2. A process according to claim 1, wherein said organosilane or organosiloxane comprises at least one member selected from the group consisting of tetraethoxysilane, tetramethoxysilane, tetramethylsilane, tetramethylcyclotetrasiloxane, octomethylcyclotetrasiloxane, diacetoxy-di-tertbutoxysilane, hexamethyldisiloxane, an their substituted compounds.

3. A process according to claim 1, wherein said gas containing H and OH is water vapor or hydrogen peroxide.

4. A process according to claim 1, wherein said thin film contains 90% by weight or less of the organic groups prior to said step of removing the organic groups from the thin film to obtain a silicon oxide film.

5. A process according to claim 4, wherein said thin film contains 20 to 60% by weight or less of the organic groups prior to said step of removing the organic groups from the thin film to obtain a silicon oxide film.

6. A process according to claim 4, wherein said thin film contains 30% by weight or less of the organic groups prior to said step of removing the organic groups from the thin film to obtain a silicon oxide film.

7. A process according to claim 6, wherein said excitation time is sufficiently short such that the organosilane or organosiloxane gas or its reaction product still contains the organic group when it reaches the substrate.

8. A process according to claim 1, wherein said excitation is conducted in a pulsing manner.

9. A process according to claim 1, wherein said step of deposition is performed at a temperature in the range of from $-50°$ to $450°$ C.

10. A process according to claim 9, wherein the step of deposition is conducted at a temperature n the range of from room temperature to $250°$ C. and the step of removing the organic groups is performed by a heat treatment step at a temperature in the range of from $250°$ to $450°$ C.

11. A process according to claim 10, wherein said thin film is irradiated with ultraviolet rays simultaneously with or subsequent to the heat treatment step.

12. A process according to claim 1, wherein the step of removing the organic groups is performed by a heat treatment step at a temperature in the range of from $250°$ to $850°$ C.

13. A process according to claim 1, wherein the step of deposition and the step of removing the organic groups are successively performed without breaking the vacuum.

14. A process according to claim 1, wherein the flow rate ratio of the gas containing H and OH to the organosilane or organosiloxane gas is 1/10 to 50 times the stoichiometric molar ratio necessary for completely hydrolyzing or oxidizing the organosilane or organosiloxane with the gas containing H and OH.

15. A process according to claim 1, wherein the step of removing the organic groups comprises subjecting the thin film to a plasma treatment.

16. A process according to claim 15, wherein said plasma treatment is conducted at a temperature in the range of from room temperature to 450° C.

17. A process according to claim 16, wherein a silicon oxide film having a desired film thickness is formed on the substrate by alternatively repeating the step of deposition and the step of plasma treatment in the same chamber.

18. A process according to claim 17, wherein the step of deposition and the step of plasma treatment are alternately conducted by intermittently stopping the supply of the organosilane or organosiloxane to the reaction chamber.

19. A process according to claim 17, wherein said excitation is performed in a pulsed manner.

20. A process according to claim 16, wherein said plasma treatment is performed by an oxygen, a hydrogen, or a water plasma and the substrate temperature is 100° to 250° C.

21. A process according to claim 20, wherein after the steps of deposition and plasma treatment, the heat treatment is performed at a temperature of 250° to 450° C.

22. A process according to claim 1, wherein at least one member selected from a phosphorus source, a boron source, and an arsenic source is introduced together with the organosilane or organosiloxane and the gas containing H and OH to incorporate at least one member selected from phosphorus, boron, and arsenic into the thin film.

23. A process according to claim 1, wherein a gas containing nitrogen is introduced together with the organosilane or organosiloxane and the gas containing H and OH to incorporate nitrogen into the thin film.

24. A process according to claim 1, wherein oxygen gas is, further, continuously or intermittently introduced into the organosilane gas or organosiloxane gas and the gas containing H and OH.

25. A process according to claim 1, wherein said deposition is performed through the use of a planar-type plasma CVD system under conditions of a pressure in a range of from 5 to 15 Torr, a temperature in a range of from room temperature to 250° C., a distance between electrodes in a range of from 6 to 25 mm, a gas flow rate in a range of from 100 to 18000 cm³/min, an RF (discharge) frequency of 13.56 MHz, a pulse period of 100 times the time required for the reaction gas to pass through between electrodes of the parallel plates, a discharge power of 100 to 500 W, a discharge "on" time satisfying a requirement represented by the formula $$D \leq \frac{300}{P} \{140 - (140/310)T\}$$

wherein D represents the length of a discharge "on" time in terms of % by assuming the time requirement for a gas to reach the substrate after the introduction thereof into the plasma region to be 100 with the upper limit of the discharge "on" time being 100%, P represents an RF power, and T represents the temperature of the substrate.

26. A process according to claim 1, wherein said silicon oxide film is a layer insulation film for multilayer interconnection of a semiconductor device.

* * * * *

UNITED STATES PATENT AND TRADEMARK OFFICE
CERTIFICATE OF CORRECTION

PATENT NO. : 5,314,724
DATED : May 24, 1994
INVENTOR(S) : TSUKUNE et al.

It is certified that error appears in the above-indentified patent and that said Letters Patent is hereby corrected as shown below:

TITLE PAGE: [75] Inventors: change "Hatanaka Masanobu" to --Masanobu Hatanaka--.

Col. 4, line 32, change "a" to --the--.

Col. 7, line 49, change "NH" to --$NH_4$--.

Col. 13, line 47, change "at" to --as--.

Col. 19, line 34, change "water" to --wafer--;
line 41, change "ration" to --ratio--.

Col. 25, line 68, after "applied to" insert --two--.

Col. 26, line 30, change "an" to --and--.

Signed and Sealed this

Tenth Day of January, 1995

Attest:

BRUCE LEHMAN

Attesting Officer

Commissioner of Patents and Trademarks